United States Patent [19]
Sakashita et al.

[11] Patent Number: 5,315,182
[45] Date of Patent: May 24, 1994

[54] SEMICONDUCTOR INTEGRATED CIRCUIT HAVING ANNULAR POWER SUPPLY WITH PLURAL LINES

[75] Inventors: Kazuhiro Sakashita; Terukazu Yusa; Isao Takimoto; Takeshi Hashizume; Tatsunori Komoike, all of Hyogo, Japan

[73] Assignee: Mitsubishi Denki Kabushiki Kaisha, Tokyo, Japan

[21] Appl. No.: 918,525

[22] Filed: Jul. 23, 1992

[30] Foreign Application Priority Data

Jul. 30, 1991 [JP] Japan .................................. 3-189103

[51] Int. Cl.⁵ ............................................. H0?? ??/02
[52] U.S. Cl. .............................. 307/482.1; ? ?5.1; 307/303.1, ?/207
[58] Field of Search ............... 257/207; 307/465, 465.1, 307/482.1, 303.1

[56] References Cited

U.S. PATENT DOCUMENTS

| | | | |
|---|---|---|---|
| 4,511,914 | 4/1985 | Remedi et al. | 257/207 X |
| 4,575,745 | 3/1986 | Sharma et al. | 257/207 |
| 4,701,778 | 10/1987 | Aneha et al. | 307/482.1 X |
| 5,008,728 | 4/1991 | Yamamura et al. | 257/207 |
| 5,079,612 | 1/1992 | Takamoto et al. | 257/207 X |

FOREIGN PATENT DOCUMENTS 2-82552 3/1990 Japan .
2-86145 3/1990 Japan .

*Primary Examiner*—David R. Hudspeth
*Attorney, Agent, or Firm*—Lowe, Price, LeBlanc & Becker

[57] ABSTRACT

In designing a layout of a semiconductor integrated circuit device having a large scale circuit block and logic circuit elements provided together, a power supply connecting line is formed rectilinearly to increase the integration density, reduce power supply noise and achieve automation of layout and interconnection. The semiconductor integrated circuit device includes one large scale circuit block and a plurality of logic circuit elements. VDD and GND annular power supply interconnecting lines are provided to surround the large scale circuit block. The annular power supply interconnecting lines extending in the lateral direction are divided into two lines to be disposed, respectively. Connection of the logic circuit elements and the annular power supply interconnecting lines are made by rectilinear VDD and GND power supply branch interconnecting lines.

11 Claims, 29 Drawing Sheets

SEMICONDUCTOR INTEGRATED CIRCUIT HAVING ANNULAR POWER SUPPLY WITH PLURAL LINES

BACKGROUND OF THE INVENTION

1. Field of the Invention

The invention relates generally to semiconductor integrated circuit devices and a method of designing a layout thereof and, more particularly, relates to power supply interconnection structures of semiconductor integrated circuit devices where logic circuit elements (standard cells) of uniform height and a large scale circuit block larger than they are arranged together, and a method of designing a layout thereof.

2. Description of the Background Art

Rapid progress is now being made in electronic circuit devices. There is an increasing tendency for an electronic circuit device of high performance and improved function to be developed in a short period of time. Therefore, it is also necessary to develop a semiconductor integrated circuit device of high performance and enhanced function in a short period of time, which is essential for development of such an electronic circuit device within a short time. It is common to use, in designing, an automatic layout and interconnection program in order to develop a semiconductor integrated circuit device within a short period of time. It is difficult to treat logic circuit elements of various shapes in creating a program if the automatic layout and interconnection program is used. Accordingly, shapes of logic circuit elements are standardized. Generally, a method (standard cell method) is employed in which the heights of logic circuit elements to be arranged and interconnected to each other are made uniform. An internal region of a semiconductor integrated circuit device is formed by stacking an appropriate number of logic circuit elements (standard cells) to be arranged in a row in a lateral direction.

Large scale integrated circuit devices (LSIs) are classified into custom LSIs and semicustom LSIs with respect to LSI layout design according to recent, common classification. A custom LSI has its whole structure or an internal block designed exclusively for the specific LSI. A semicustom LSI is designed using a library in which layout patterns designed in advance as common circuits are registered. The above-mentioned standard cell method is classified as a method of designing a semicustom LSI according to the definition.

The standard cell method is a kind of method of designing a semicustom LSI in which an LSI is designed using standard circuit block cells which are designed and registered in a cell library in advance. Each circuit block cell is arranged according to an automatic layout and interconnection program of a CAD system. Standard cells as standard circuit block cells to be registered in the library are normally of layout patterns of a simple logic gate and logic circuits such as flipflops and so on designed in advance. Once these standard layout patterns are designed and their operation with accuracy is verified by a simulation or experiment, they are registered in a data base so as to make up a cell library. The standard layout patterns have geometrical configurations of uniform height and variable width. In short, in designing a layout of an LSI according to the standard cell method, standard layout patterns are taken out from the library and arrangement and interconnection of each layout pattern are made by the CAD system.

FIG. 20 is a plan view showing an arrangement of a semiconductor integrated circuit device according to a conventional standard cell method. Referring to FIG. 20, a peripheral circuit 2 such as an input/output buffer circuit is provided in the peripheral portion of a chip to be a substrate of a semiconductor integrated circuit device 1. A plurality of logic circuit elements 4 of the same height are arranged in a row in the lateral direction in the internal region of the chip surrounded by peripheral circuit 2. Power supply branch interconnecting lines 7 and 8 of VDD potential and GND potential for supplying VDD potential and GND potential to each of logic circuit element 4 are connected to each logic circuit element 4. A certain number of power supply trunk interconnecting lines 9 and 10 required for designing are arranged on the left and right sides of the chip and in a region interposed therebetween, for supplying the potentials VDD and GND to power supply branch interconnecting lines 7 and 8, respectively. Power supply terminals for logic circuit elements 4 are provided on the left and right sides of logic circuit elements 4. Adjacent two logic circuit elements are connected to each other by means of a rectilinear power supply interconnecting line. As a result, a pair of power supply branch interconnecting lines 7 and 8 are formed for a row of logic circuit elements 4. Power supply trunk interconnecting lines 9 and 10 are provided for supplying necessary power to the plurality of upper and lower power supply branch interconnecting lines 7 and 8 which are appropriately provided. Though not shown in FIG. 20, relatively thin signal interconnecting lines are provided in a region outside of the row of logic circuit elements 4 or a region above the row of logic circuit elements 4. Furthermore, as for these power supply branch interconnecting lines 7 and 8 and power supply trunk interconnecting lines 9 and 10, basically, the interconnecting lines in the lateral direction are adjusted to form first interconnecting layers and the interconnecting lines in the longitudinal direction are adjusted to form second interconnecting layers for the whole device. Different interconnection layers are connected to each other by a connection hole formed at a desired position of an insulating layer between the interconnection layers. In this way, automation of arrangement and interconnection can be effectively and readily achieved by using a systematic method of forming a chip including power supply interconnecting lines.

However, a more improved performance has been strongly demanded in recent years, so that the need has arisen for developing a semiconductor integrated circuit device of improved performance and function within a short period of time. Under such circumstances, there is a need for forming a semiconductor integrated circuit device by arranging together a large scale circuit block which is large in scale to some degree and has a definite function and logic circuit elements of the same height, instead of using only logic circuit elements of the same height as in the conventional manner. The large scale circuit block is, in advance, made up of elements of high integration density so as to have a high performance. The large scale circuit block may be, for example, a memory (random access memory or read only memory), a PLA, a multiplier or the like. Such a large scale circuit block has its pattern already formed when arrangement and interconnection of the whole chip is performed. Also, then, the configuration of interconnecting lines and positions of terminals in the power supply system have been already determined in the large scale circuit block. Accordingly, in many cases, it is not necessarily easy to interconnect the power supply systems of the large scale circuit block and the adjacent logic circuit elements of uniform heights. As a result, the power supply interconnecting lines of the logic circuit elements and the large scale circuit block cannot be standardized, making it difficult to automate the interconnection.

FIG. 21 is a flow chart showing a method of designing the layout of the semiconductor integrated circuit device on which the large scale circuit block and the logic circuit elements are arranged together. FIGS. 22 to 24 are plan views showing the plane arrangement of the semiconductor integrated circuit device according to FIG. 21. The method of designing the layout of the conventional semiconductor integrated circuit device will now be described with reference to these drawings.

Referring to step 201 of FIG. 21 and FIG. 22, a peripheral circuit 2 including an I/O buffer circuit and so on is provided on the peripheral region of chip 1 to be the substrate of the semiconductor integrated circuit device.

Then, referring to step 202 of FIG. 21 and FIG. 23, functional cells are provided in an internal region surrounded by peripheral circuit 2. One large scale circuit block 3 and a plurality of logic circuit elements 4 of the same height, for example, are provided as functional cells.

Referring to step 203 of FIG. 21 and FIG. 24, power supply trunk interconnecting lines 9 and 10 for VDD and GND and power supply branch interconnecting lines 7 and 8 for VDD and GND are so provided as to be interconnected to each other between each logic circuit element 4 and large scale circuit block 3. In this case, interconnecting lines 15 for signals are also provided between logic circuit elements 4. Arrangement of the power supply interconnecting lines and the interconnecting lines for signals is made by the automatic layout and interconnection program.

Thereafter, a determination is made as to whether the arrangement of the power supply interconnecting lines and the interconnecting lines for signals made by the automatic layout and interconnection program meets a prescribed condition as shown in step 204 of FIG. 21. If the arrangement of the interconnecting lines does not meet the prescribed condition, rearrangement of the power supply interconnecting lines, the interconnecting lines for signals, functional cells, and the I/O buffer is performed as shown in FIG. 21. In this way, the trial-and-error is repeated and the power supply interconnecting lines and the interconnecting lines for signals are rearranged until the prescribed condition is met.

In accordance with the conventional method of designing the layout, however, if the power supply interconnecting lines are to be arranged by the automatic layout and interconnection program, thick interconnecting lines, for example, power supply trunk interconnecting lines 9 and 10 for VDD and GND are provided as being bent as shown in FIG. 24. As a result, more chip area is required in designing the semiconductor integrated circuit device having a prescribed logical function. Manual designing has been inevitably employed in order to control the increase of the chip area as much as possible.

Normally, interconnection includes rough interconnection and minute interconnection which are separately performed. It is possible to arrange interconnecting lines for signals and power supply interconnecting lines separately in the stage of rough interconnection. However, as the interconnecting lines for signals and the power supply interconnecting lines are arranged in a mixed manner in the stage of minute interconnection, even if the power supply interconnecting lines are designated as being rectilinear in the stage of rough interconnection, the power supply interconnecting lines are bent in the stage of minute interconnection.

Methods for solving the problem as stated above have been proposed, for example, in Japanese Patent Laying-Open No. 2-82552 and Japanese Patent Laying-Open No. 2-86145, in which a sufficiently wide annular power supply interconnecting line is provided around the large scale circuit block.

An arrangement of a semiconductor integrated circuit device according to the proposal of the above-mentioned article is shown in FIG. 25. Referring to FIG. 25, annular power supply interconnecting lines are provided as surrounding the circumference of large scale circuit block 3. The annular power supply interconnecting lines include power supply interconnecting lines 5 and 6 of VDD and GND for supplying VDD potential and GND potential, respectively.

FIG. 26 is an enlarged detail view of a portion XXVI surrounded by the broken line of FIG. 25. As shown in FIG. 26, the annular power supply interconnecting line of VDD is made up of a first VDD annular interconnecting line 51 including a first lateral interconnection layer and a second VDD annular interconnecting line 52 including a second longitudinal interconnection layer. The annular power supply interconnecting line of GND is made up of a first GND annular interconnecting line 61 including a first lateral interconnection layer and a second GND annular interconnecting line 62 including a second longitudinal interconnection layer. The first VDD annular interconnecting line 51 and the second VDD annular interconnecting line 52 are electrically connected to each other through a connection hole 53b formed in an interlayer insulating film. The first GND annular interconnecting line 61 and the second GND annular interconnecting line 62 are electrically connected to each other through a connection hole 63b.

Logic circuit elements 4a and 4b are provided with VDD terminals 47 and GND terminals 48 for supplying VDD potential and GND potential, respectively. In the logic circuit elements 4a and 4b, the two VDD terminals 47 and 47 and the two GND terminals 48 and 48 that are facing each other are connected together by means of the first interconnection layer in advance. A first lateral VDD branch lines 71 including the first interconnection layer is connected to each VDD terminal 47. A first lateral GND branch line 81 including the first interconnection layer is connected to each GND terminal 48.

GND terminal 48 of logic circuit element 4a is connected to the second GND annular interconnecting line 62 by the first rectilinear GND branch line 81. VDD terminal 47 of logic circuit element 4b is connected to the first VDD annular interconnecting line 51 by the first rectilinear VDD branch line 71. The first GND branch line 81 is connected to the second GND annular interconnecting line 62 through a connection hole 63a. However, connection of VDD terminal 47 of logic circuit element 4a and the second VDD annular interconnecting line 52 and connection of GND terminal 48 of logic circuit element 4b and the first GND annular interconnecting line 61 are not made by a rectilinear power supply branch line. That is, the first VDD branch line 71 connected to VDD terminal 47 of logic circuit element 4a is connected to a second longitudinal VDD branch line 72 including the second interconnection layer through a connection hole 73b. The second VDD branch line 72 is connected to the first VDD branch line 71 through a connection hole 73a. The first VDD branch line 71 is connected to the second VDD annular interconnecting line 52 through a connection hole 53a. The first GND branch line 81 connected to GND terminal 48 of logic circuit element 4b is connected to a second longitudinal GND branch line 82 including the second interconnection layer through a connection hole 83b. The second GND branch line 82 is connected to the first GND branch line 81 through a connection hole 83a. The first GND branch line 81 is connected to the first GND annular interconnecting line 61.

In this way, provision of wide annular power supply interconnecting lines around large scale circuit block 3 standardizes and makes easy connection of many power supply branch interconnecting lines of the logic circuit elements adjacent to the large scale circuit block and annular power supply interconnecting lines. That is, the power supply branch interconnecting lines are arranged rectilinearly. As shown in FIG. 26, however, part of power supply branch interconnecting lines must inevitably be bent to be interconnected. Accordingly, providing only annular power supply interconnecting lines leaves portions where the power supply interconnecting lines cannot be simplified or standardized.

FIG. 27 is a plan view showing another example of the conventional semiconductor integrated circuit device having annular power supply interconnecting lines provided thereon. FIG. 28 is an enlarged view of a portion XXVIII surrounded by a broken line in FIG. 27. Referring to FIG. 28, a VDD terminal 47 of a logic circuit element 4a is connected to a first VDD annular interconnecting line 51 by a first rectilinear VDD branch line 71 and a GND terminal 48 of logic circuit element 4b is connected to a first GND annular interconnecting line 61 by a first rectilinear GND branch line 81. VDD terminal 47 of logic circuit element 4b is connected to a second VDD annular interconnecting line 52 by the first VDD branch line 71 through a connection hole 53b. However, connection of GND terminal 48 of logic circuit element 4a and the first GND annular interconnecting line 61 is not made by a rectilinear power supply branch interconnecting line. That is, the first GND branch line 81 connected to GND terminal 48 of logic circuit element 4a is connected to a second GND branch line 82 through a connection hole 83a. The second GND branch line 82 is connected to the first GND branch line 81 through a connection hole 83b. The bent interconnecting line thus connects GND terminal 48 of logic circuit element 4a to the first GND annular interconnecting line 61.

Annular power supply interconnecting lines 51, 52, 61 and 62 shown in FIGS. 26 and 28 have almost the same width as the heights of logic circuit elements 4a and 4b. As the power consumption of large scale circuit block 3 is large, a wide power supply interconnecting line is provided in order to supply sufficient power. Accordingly, the space between the two power supply branch interconnecting lines connected to the logic circuit elements do not conform to the annular power supply interconnecting lines. As a result, the bent power supply branch interconnecting lines are required at the connections of the logic circuit elements and the annular power supply interconnecting lines as shown in FIGS. 26 and 28.

FIG. 29 is a plan view showing still another example of the conventional semiconductor integrated circuit device having annular power supply interconnecting lines provided thereon. FIG. 30 is an enlarged view of a portion XXX surrounded by the broken line in FIG. 29. Referring to FIG. 30, the widths of annular power supply interconnecting lines 51, 52, 61 and 62 are smaller than the height of logic circuit element 4 in this example. The first VDD annular interconnecting line 51 and the first GND annular interconnecting line 61 diagonally face a VDD terminal 47 and a GND terminal 48 of logic circuit element 4, respectively. Therefore, connection of VDD terminal 47 of logic circuit element 4 and the first VDD annular interconnecting line 51 and connection of GND terminal 48 of logic circuit element 4 and the first GND annular interconnecting line 61 are made by bent power supply branch interconnecting lines, respectively. That is, a first VDD branch line 71 connected to VDD terminal 47 is connected to a second VDD branch line 72 through a connection hole 73b. The second VDD branch line 72 is connected to the first VDD branch line 71 through a connection hole 73a. VDD terminal 47 is thus connected to the first VDD annular interconnecting line 51. A first GND branch line 81 connected to GND terminal 48 is connected to a second GND branch line 82 through a connection hole 83a. The second GND branch line 82 is connected to the first GND branch line 81 through a connection hole 83b. GND terminal 48 is thus connected to the first GND annular interconnecting line 61.

As shown in FIG. 30, also in the case where the annular power supply interconnecting lines diagonally face the power supply branch interconnecting lines on a potential basis, the power supply branch interconnecting lines are bent for connecting the annular power supply interconnecting lines and the logic circuit elements. As a result, arrangement of all the power supply interconnecting lines cannot be simplified or standardized.

Connection lines for large scale circuit block 3 and annular power supply interconnecting lines 5 and 6 are omitted in FIGS. 25, 27 and 29.

FIG. 31 is a plan view particularly showing connection of a large scale circuit block and annular power supply interconnecting lines in a conventional semiconductor integrated circuit device having the annular power supply interconnecting lines provided thereon. FIG. 32 is an enlarged view of a portion XXXII surrounded by the broken line in FIG. 31. Referring to FIG. 32, a VDD terminal 13 and a GND terminal 14 are provided in the large scale circuit block 3. A VDD annular power supply interconnecting line includes first VDD annular interconnecting lines 51 and second VDD annular interconnecting lines 52. The first VDD annular interconnecting lines 51 are electrically connected to the second VDD annular interconnecting lines 52 through connection holes 53a, 53b, 53c and 53d. A GND annular power supply interconnecting line includes first GND annular interconnecting lines 61 and second GND annular interconnecting lines 62. The first GND annular interconnecting lines 61 are electrically connected to the second GND annular interconnecting lines 62 through connection holes 63a, 63b, 63c and 63d.

VDD terminal 13 of large scale circuit block 3 is connected to the second VDD annular interconnecting line 52 by a VDD connecting line 11. VDD connecting line 11 is connected to the second VDD annular interconnecting line 52 through connection holes 53p and 53q. GND terminal 14 of large scale circuit block 3 is connected to the second GND annular interconnecting line 62 by a GND connecting line 12. GND connecting line 12 is connected to the second GND annular interconnecting line 62 through a connection hole 63p.

A VDD terminal 47 of a logic circuit element 4 is connected to the second VDD annular interconnecting line 52 by a first VDD branch line 71 extending in a lateral direction. A GND terminal 48 of logic circuit element 4 is connected to the second GND annular interconnecting line 62 by a first GND branch line 81. The first VDD branch line 71 is connected to the second VDD annular interconnecting line 52 through a connection hole 53e. The first GND branch line 81 is connected to the second GND annular interconnecting line 62 through a connection hole 63e.

In this way, connection of logic circuit element 4 and the annular power supply interconnecting lines is made by power supply branch interconnecting lines 71 and 81 extending in the lateral direction in the same way as the connection of large scale circuit block 3 and the annular power supply interconnecting lines. Accordingly, in some cases, configuration of connecting lines for the annular power supply interconnecting lines and the large scale circuit block becomes complicated depending on the relationship between a position of logic circuit element 4 and positions of VDD and GND terminals 13 and 14 of large scale circuit block 3. That is, as shown in FIG. 32, the configuration of VDD connecting line 11 is complicated in connecting VDD terminal 13 of large scale circuit block 3 and the second VDD annular interconnecting line 52. Therefore, in some cases, the connecting line for the large scale circuit block and the annular power supply interconnecting line is not provided rectilinearly. As a result, arrangement of the connecting lines for the annular power supply interconnecting lines and the large scale circuit block cannot be standardized.

In the conventional semiconductor integrated circuit devices, there was a problem that the power supply branch interconnecting lines connected to the annular power supply interconnecting lines could not be formed rectilinearly in order to supply VDD potential and GND potential to the logic circuit element since the power supply interconnecting lines were structured as stated above. Also, the connecting lines could not be formed rectilinearly in connecting the large scale circuit block and the annular power supply interconnecting lines. Therefore, it was difficult to simplify and standardize the arrangement of the power supply interconnecting lines.

In a case as stated above, as power supply branch interconnecting lines which are wider than general interconnecting lines for signals are formed to be bent in a complicated manner, integration density of the semiconductor integrated circuit device is decreased. Also, the impedance of the power supply branch interconnecting lines is increased, so that power supply noise is increased. Furthermore, since the power supply branch interconnecting lines and the connecting lines between the large scale circuit block and the annular power supply interconnecting lines cannot be formed into fixed configurations, it is more difficult to automate arrangement of various logic circuit blocks, power supply interconnecting lines and so on.

SUMMARY OF THE INVENTION

An object of the present invention is to form a connecting line and a power supply branch interconnecting line in a most linear manner in a semiconductor integrated circuit device to improve the integration density.

Another object of the present invention is to reduce power supply noise in a semiconductor integrated circuit device.

A further object of the present invention is to facilitate automation of allocating a logic circuit block and a power supply interconnection in a layout design method of a semiconductor integrated circuit device.

A semiconductor integrated circuit device according to a first aspect of the present invention includes a first logic circuit block, a second logic circuit block, an annular power supply line, and a power supply connecting line. The first logic circuit block is provided on a substrate. The second logic circuit block is placed on the substrate and smaller than the first logic circuit block. The annular power supply line is so provided on the substrate as to surround the first logic circuit block. The annular power supply line includes a first power supply line and a second power supply line. The first power supply line extends in a first direction. The second power supply line extends in a second direction crossing the first direction and is connected to the first power supply line. The first power supply line includes an interconnection portion extending in the first direction and divided into a plurality of lines. The power supply connecting line connects the second logic circuit block to the annular power supply line and is provided on the substrate, extending in the first direction.

A semiconductor integrated circuit device in accordance with a second aspect of the present invention includes a first logic circuit block, a second logic circuit block, an annular power supply line, a first power supply connecting line and a second power supply connecting line. The first logic circuit block is placed on a substrate. The second logic circuit block, which is smaller than the first logic circuit block, is placed on the substrate. The annular power supply line is so placed on the substrate as to surround the first logic circuit block. The annular power supply line includes a first power supply line and a second power supply line. The first power supply line extends in a first direction. The second power supply line extends in a second direction crossing the first direction and is connected to the first power supply line. The first power supply connecting line is so placed on the substrate as to connect the first logic circuit block to the first power supply line and extend in the second direction. The second power supply connecting line is so placed on the substrate as to connect the second logic circuit block to the second power supply line and extend in the first direction.

In accordance with a method of designing a layout of a semiconductor integrated circuit device according to a third aspect of the present invention, firstly, a first logic circuit block is placed on a substrate. A second logic circuit block smaller than the first logic circuit block is placed on the substrate. An annular power supply line is placed on the substrate, surrounding the first logic circuit block. The annular power supply line includes a first power supply line extending in a first direction and a second power supply line extending in a second direction crossing the first direction and connected to the first power supply line. The annular power supply line is so placed that the first power supply line includes an interconnection portion extending in the first direction and divided into a plurality of lines. A power supply connecting line is placed on the substrate, connecting the second logic circuit block to the annular power supply line and extending in the first direction.

In accordance with a method of designing a layout of a semiconductor integrated circuit device according to a fourth aspect of the present invention, a first logic circuit block is provided on a substrate. A second logic circuit block smaller than the first logic circuit block is placed on the substrate. An annular power supply line is placed on the substrate, surrounding the first logic circuit block. The annular power supply line includes a first power supply line extending in a first direction and a second power supply line extending in a second direction crossing the first direction and connected to the first power supply line. A power supply connecting line is placed on the substrate, connecting the second logic circuit block to the first annular power supply line and extending in the first direction. The power supply connecting line is so placed as to be aligned with the first power supply line.

In accordance with the first and third aspects of the present invention, the first power supply line includes an interconnection portion extending in the first direction and divided into a plurality of lines. Accordingly, in connecting the second logic circuit block and the annular power supply line, the power supply connecting line can be placed to be aligned with any of the plurality of lines of the interconnection portion. Since the first power supply line is divided into a plurality of lines, the power supply connecting line can be provided to extend in a region between the divided interconnection portions. Accordingly, the power supply connecting line connecting the second logic circuit block to the annular power supply line can be placed to extend rectilinearly in the first direction. As a result, the configuration of the power supply connecting line can be simplified. Also, the interconnection length of the power supply connecting line can be reduced.

In accordance with the second aspect of the present invention, in connecting the first logic circuit block and the annular power supply line, the first power supply connecting line is so placed as to extend in the second direction. In connecting the second logic circuit block and the annular power supply line, the second power supply connecting line is so placed as to extend in the first direction. Accordingly, since the first power supply connecting line is placed to extend in a direction different from that of the second power supply connecting line, it can be provided rectilinearly. As a result, the configuration of the first power supply connecting line is simplified.

In accordance with the fourth aspect of the present invention, the first power supply line and the power supply connecting line are placed to be aligned with each other. Accordingly, the power supply connecting line is so placed as to extend rectilinearly in the first direction in connecting the second logic circuit block and the annular power supply line. As a result, the configuration of the power supply connecting line is simplified. The interconnection length of the power supply connecting line is also reduced.

Because of the facts stated above, an area occupied by the power supply connecting line can be reduced by rectilinear arrangement of the power supply connecting line according to the present invention. Additionally, since the interconnection length of the power supply connecting line is reduced, the interconnection impedance is decreased. As a result, the power supply noise can be reduced. Furthermore, in the entire layout of the semiconductor integrated circuit device, the power supply connecting line is placed rectilinearly to have a simple structure, so that automation of layout and interconnection can be easily achieved in designing the layout of the semiconductor integrated circuit device. As a result, a semiconductor integrated circuit device of high performance and enhanced function can be obtained in a short period of time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
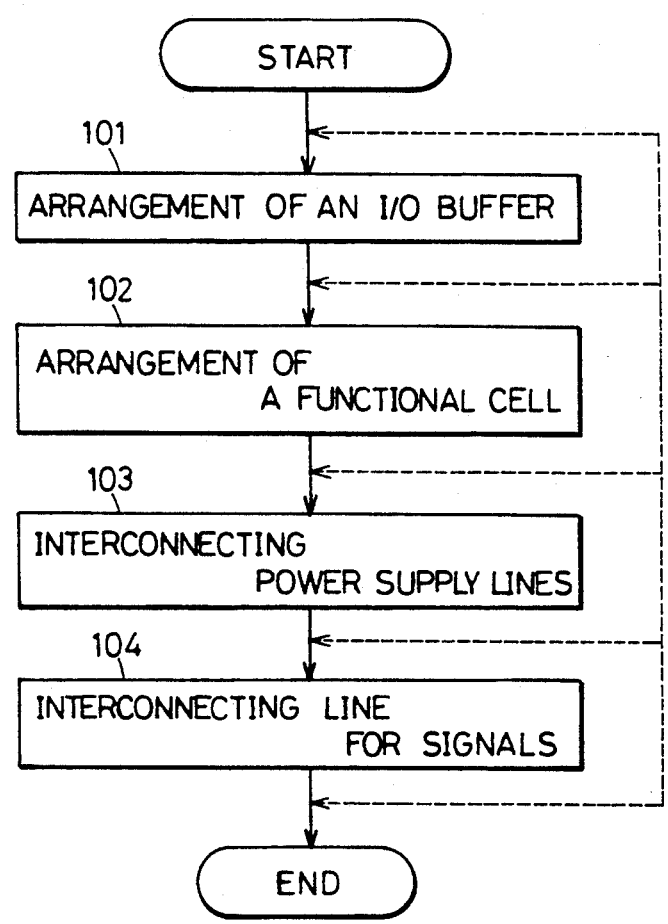
FIG. 1 is a flow chart showing a method of designing a layout of a semiconductor integrated circuit device in accordance with one embodiment of the present invention.

FIG. 1 is a flow chart showing a method of designing a layout of a semiconductor integrated circuit device in accordance with one embodiment of the present invention. FIGS. 2-5 are plan views showing arrangements of the semiconductor integrated circuit device according to the flow chart of FIG. 1. An outline of the method of designing the layout of the semiconductor integrated circuit device in accordance with this invention will now be described with reference to these drawings.

Figure 2:
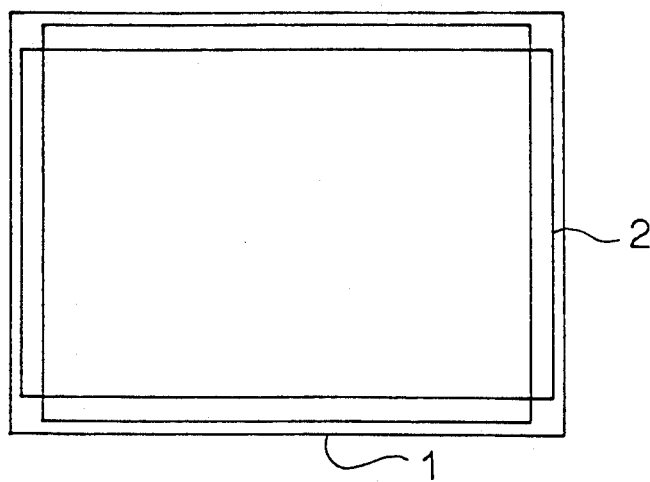
FIG. 2 is a plan view showing an arrangement according to a first process of the method of designing the layout of the semiconductor integrated circuit device in accordance with one embodiment of the present invention.

Firstly, referring to step 101 of FIG. 1 and FIG. 2, a peripheral circuit 2 including an I/O buffer is placed in a peripheral region of a chip 1 to be a substrate of a semiconductor integrated circuit device.

Figure 3:
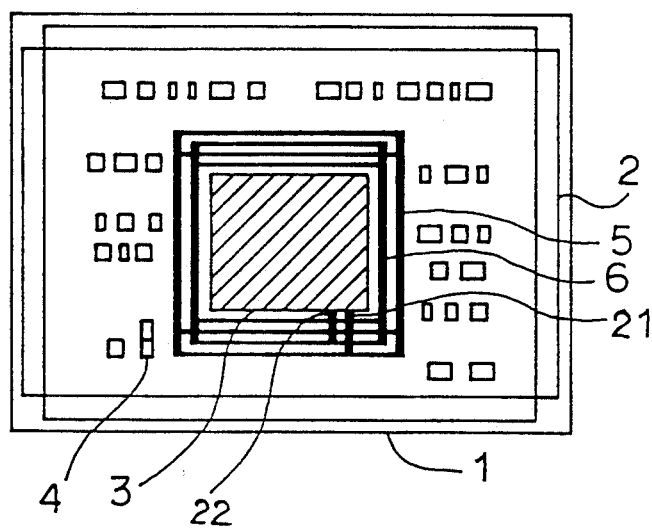
FIG. 3 is a plan view showing an arrangement according to a second process of the method of designing the layout of the semiconductor integrated circuit device in accordance with one embodiment of the present invention.

Referring to step 102 of FIG. 1 and FIG. 3, functional cells are placed in a region surrounded by peripheral circuit 2. One large scale circuit block 3 and a plurality of logic circuit elements 4 of the same height, for example, are disposed as functional cells. Annular power supply interconnecting lines are formed, surrounding large scale circuit block 3. The annular power supply interconnecting lines include a VDD annular power supply interconnecting line 5 and a GND annular power supply interconnecting line 6. As shown in FIG. 3, VDD annular power supply interconnecting line 5 and GND annular power supply interconnecting line 6 extending in the lateral direction branch into two lines, respectively. Large scale circuit block 3 is electrically connected to VDD annular power supply interconnecting line 5 and GND annular power supply interconnecting line 6 by a VDD connecting line 21 and a GND connecting line 22, respectively.

Figure 4:
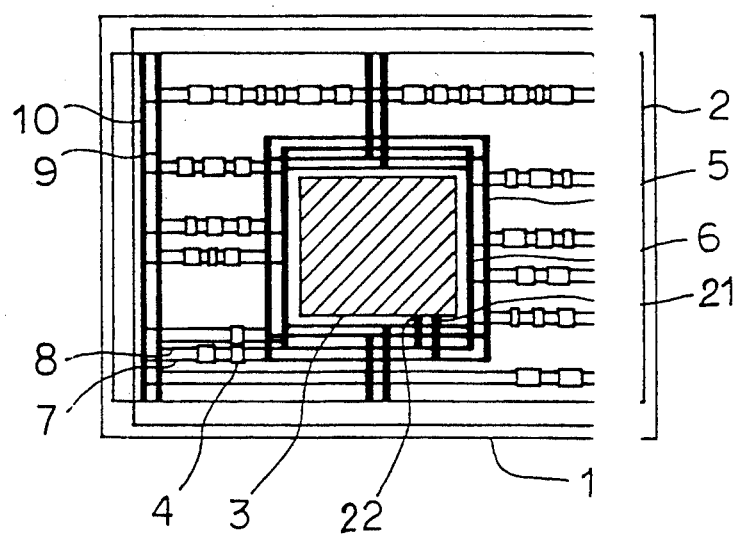
FIG. 4 is a plan view showing an arrangement according to a third process of the method of designing the layout of the semiconductor integrated circuit device in accordance with one embodiment of the present invention.

As shown in step 103 of FIG. 1 and FIG. 4, a VDD power supply trunk interconnecting line 9 and a GND power supply trunk interconnecting line 10 are disposed in the regions on the left and right sides and in the central region of the chip. A VDD power supply branch interconnecting line 7 and a GND power supply branch interconnecting line 8 are so disposed as to extend rectilinearly in the lateral direction to be connected to power supply branch interconnecting lines 9 and 10 and annular power supply interconnecting lines 5 and 6, respectively.

Figure 5:
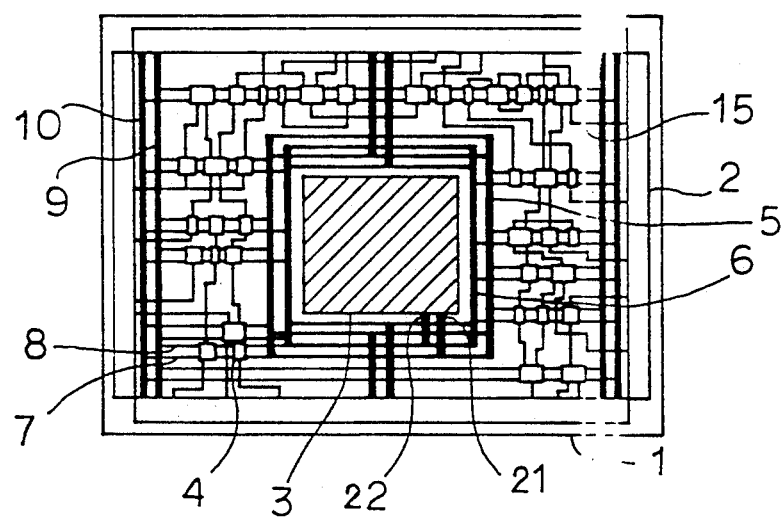
FIG. 5 is a plan view showing an arrangement according to a fourth process of the method of designing the layout of the semiconductor integrated circuit device in accordance with one embodiment of the present invention.

As shown in step 104 of FIG. 1 and FIG. 5 interconnecting lines 15 for signals are provided between logic circuit elements 4.

VDD connecting line 21 and GND connecting line 22 are so arranged as to extend in the longitudinal direction which is different from the direction in which power supply branch interconnecting lines 7 and 8 extend. As stated below, since part of annular power supply interconnecting line 6 is divided, power supply branch interconnecting lines 7 and 8 are so disposed as to extend in the lateral direction in connecting annular power supply interconnecting lines 5 and 6 and the logic circuit element 4. As a result, connecting lines 21 and 22 and power supply branch interconnecting lines 7 and 8 are not disposed to be bent. Accordingly, a less area is occupied by the power supply branch interconnecting lines and the connecting lines. In other words, a chip area required in designing a layout of a semiconductor integrated circuit device having a predetermined logic function can be reduced. This makes it easy to estimate a required chip area in an early stage of designing the layout.

Additionally, the loop processing indicated by the broken line in FIG. 1, i.e., processing in which trial-and-error is repeated can be reduced. This makes easy automation of layout and interconnection in designing a layout of a semiconductor integrated circuit device.

Figure 6:
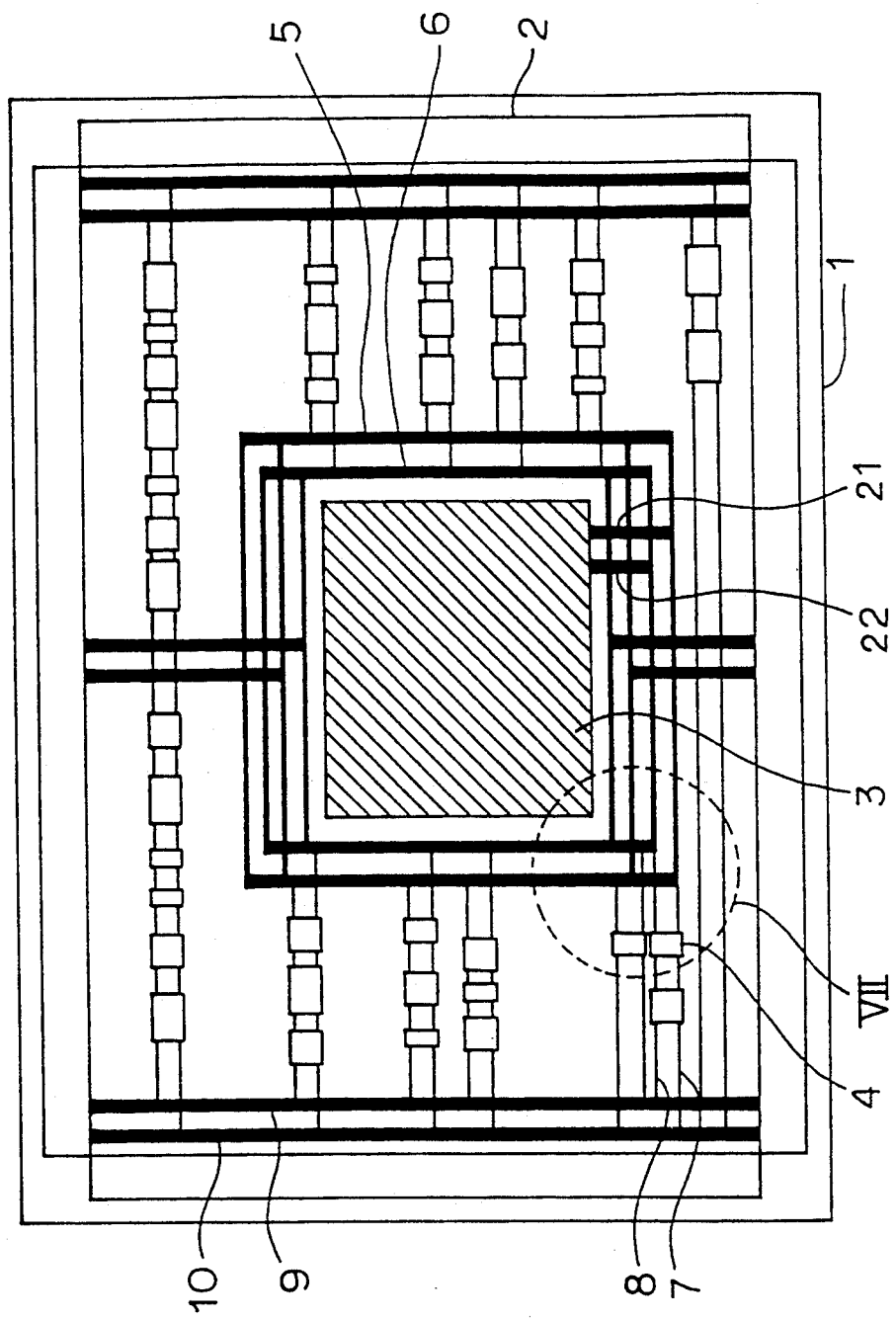
FIG. 6 is a plan view showing an arrangement of the semiconductor integrated circuit device in accordance with one embodiment of the present invention.
Figure 7:
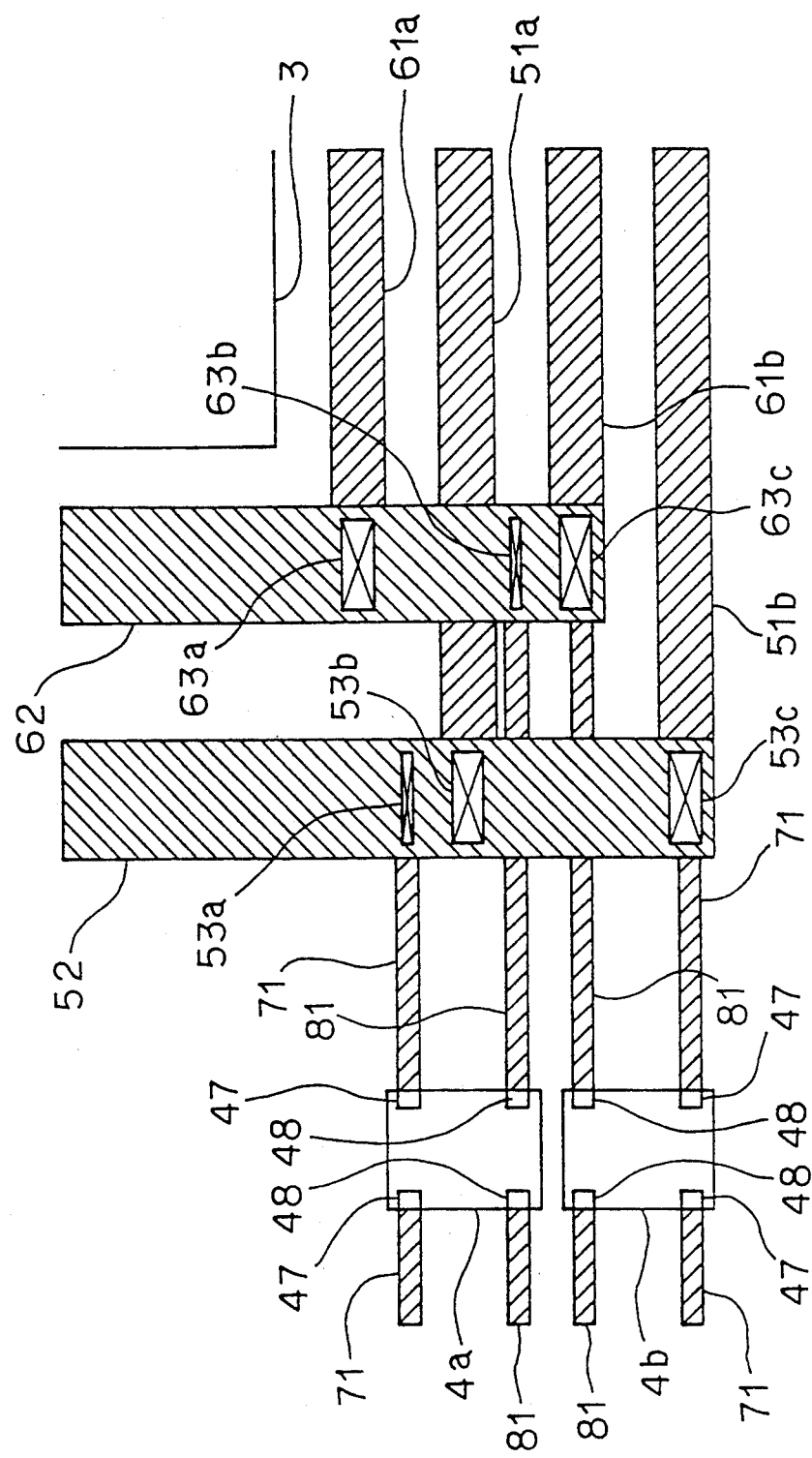
FIG. 7 is an enlarged view of a portion VII surrounded by the broken line in FIG. 6.

FIG. 6 is a plan view showing an arrangement of a semiconductor integrated circuit device in accordance with one embodiment of the present invention. FIG. 7 is an enlarged view of a portion VII surrounded by the broken line in FIG. 6. Referring to these drawings, a VDD annular power supply interconnecting line 5 includes first VDD annular interconnecting lines 51a and 51b and a second VDD annular interconnecting line 52. A GND annular power supply interconnecting line 6 includes first GND annular interconnecting lines 61a and 61b and a second GND annular interconnecting line 62. The first VDD annular interconnecting lines 51a and 51b and the first GND annular interconnecting lines 61a and 61b include a first interconnection layer and are arranged to extend in the lateral direction. The second VDD annular interconnecting line 52 includes a second interconnection layer and is so disposed as to extend in the longitudinal direction. The second GND annular interconnecting line 62 includes the second interconnection layer and is disposed to extend in the longitudinal direction. The first VDD annular interconnecting line 51a is electrically connected to the second VDD annular interconnecting line 52 through a connection hole 53b. The first VDD annular interconnecting line 51b is connected to the second VDD annular interconnecting line 52 through a connection hole 53c. The first GND annular interconnecting line 61a is electrically connected to the second GND annular interconnecting line 62 through a connection hole 63a. The first GND annular interconnecting line 61b is connected to the second GND annular interconnecting line 62 through a connection hole 63c. In this way, the VDD and GND annular power supply interconnecting lines extending in the lateral direction are divided into two lines, respectively.

Logic circuit elements 4a and 4b are provided with VDD terminals 47 and GND terminals 48 for supplying VDD potential and GND potential, respectively. Connection of the two VDD terminals 47 and 47 and connection of the two GND terminals 48 and 48, which face each other, respectively, are made inside logic circuit elements 4a and 4b. VDD terminal 47 of logic circuit element 4a is connected to the second VDD annular interconnecting line 52 through a first VDD branch line 71. The first VDD branch line 71 includes the first interconnection layer and is so formed as to extend in the lateral direction. The first VDD branch line 71 is connected to the second VDD annular interconnecting line 52 through a connection hole 53a. GND terminal 48 of logic circuit element 4a is connected to the second GND annular interconnecting line 62 by a first GND branch line 81. The first GND branch line 81 includes the first interconnection layer and is so formed as to extend in the lateral direction. The first GND branch line 81 is connected to the second GND annular interconnecting line 62 through a connection hole 63b. GND terminal 48 of logic circuit element 4b is connected to the first GND annular interconnecting line 61b by the first GND branch line 81. VDD terminal 47 of logic circuit element 4b is connected to the first VDD annular interconnecting line 51b by the first VDD branch line 71.

As stated above, provision of the plurality of divided first VDD annular interconnecting lines 51a and 51b and first GND annular interconnecting lines 61a and 61b allows connection of the terminals of logic circuit elements and the annular power supply interconnecting lines using branch interconnecting lines extending rectilinearly.

Figure 8:
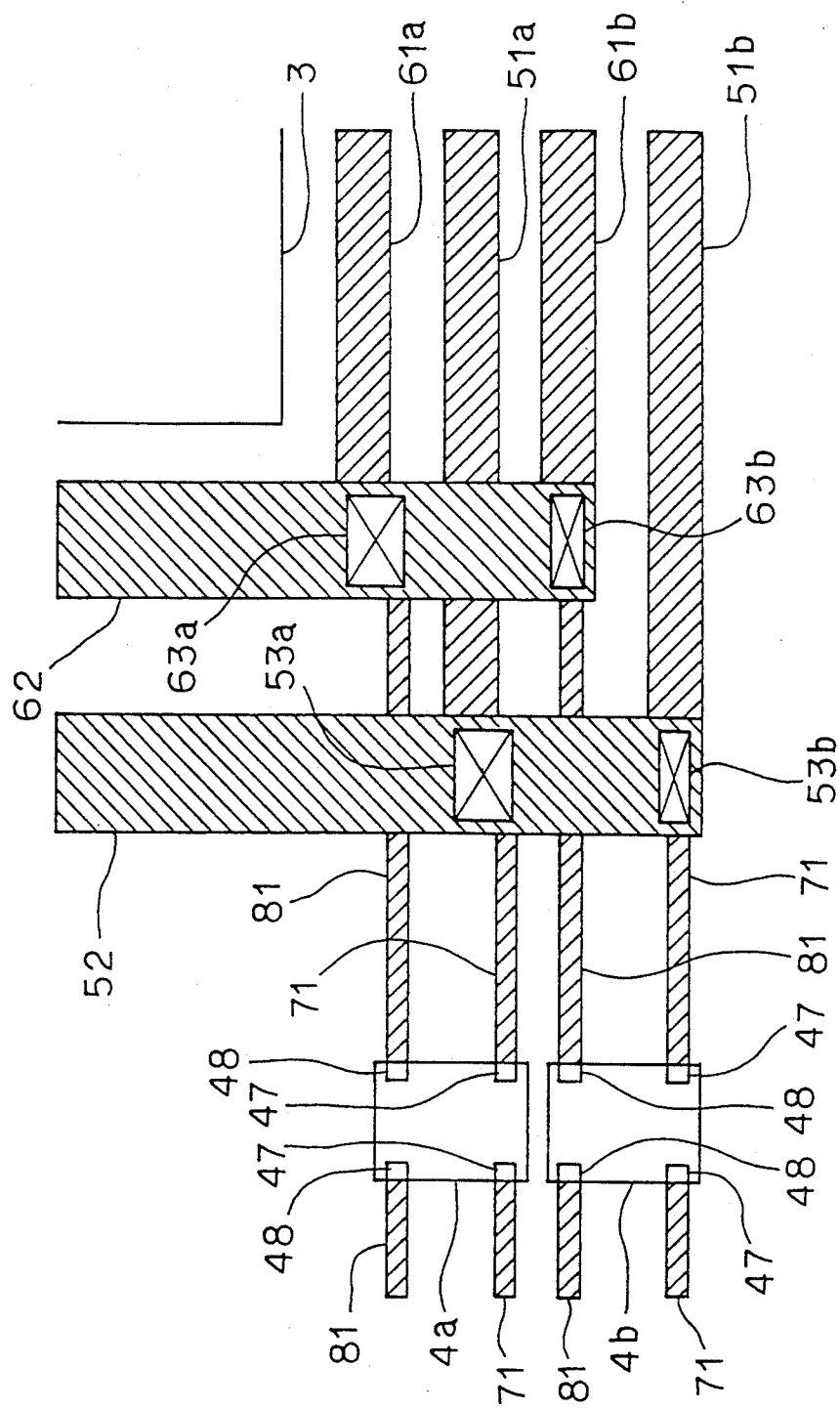
FIG. 8 is a partially enlarged view showing the connection structure of power supply interconnecting lines of another type corresponding to FIG. 7 in accordance with the first embodiment.

FIG. 8 is an enlarged view of a connection structure of power supply interconnecting lines in another embodiment corresponding to FIG. 7. In FIG. 7, GND terminals 48 face each other between logic circuit elements 4a and 4b. In FIG. 8, however, each GND terminal 48 is provided at the upper portions of logic circuit elements 4a and 4b. Even if arrangement of VDD and GND terminals 47 and 48 in logic circuit elements 4a and 4b is different from that in FIG. 7, VDD and GND terminals 47 and 48 can be connected to the annular power supply interconnecting lines by the first VDD branch lines 71 and the first GND branch lines 81 extending rectilinearly.

Figure 9:
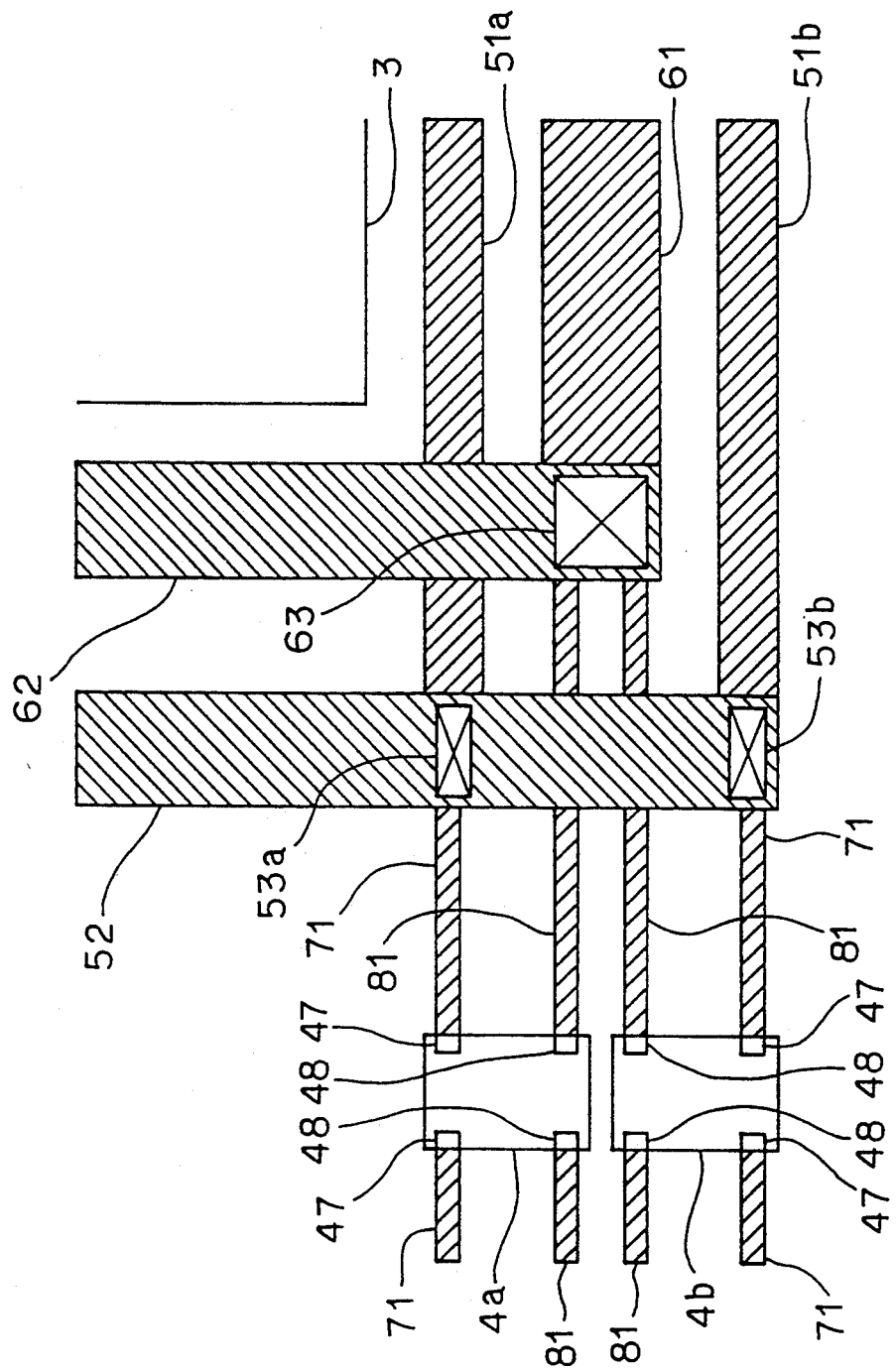
FIG. 9 is a partially enlarged view showing the connection structure of power supply interconnecting lines of still another type corresponding to FIG. 7 in accordance with the first embodiment.

FIG. 9 is an enlarged view of a connection structure of power supply interconnecting lines in still another embodiment corresponding to FIG. 7. In FIG. 7, two divided first VDD annular interconnecting lines 51a and 51b and first GND annular interconnecting lines 61a and 61b are provided both for the VDD annular power supply interconnecting line and the GND annular power supply interconnecting line. In contrast with this, as shown in FIG. 9, two divided first VDD annular interconnecting lines 51a and 51b are provided only for the VDD power supply interconnecting line. In this way, even if one of the two annular power supply interconnecting lines for providing potential is divided into a plurality of lines, the effects in the present invention can be achieved. That is, first VDD branch lines 71 and first GND branch lines 81 can be arranged to extend rectilinearly in connecting the annular power supply interconnecting lines and each terminal of the logic circuit elements.

Figure 10:
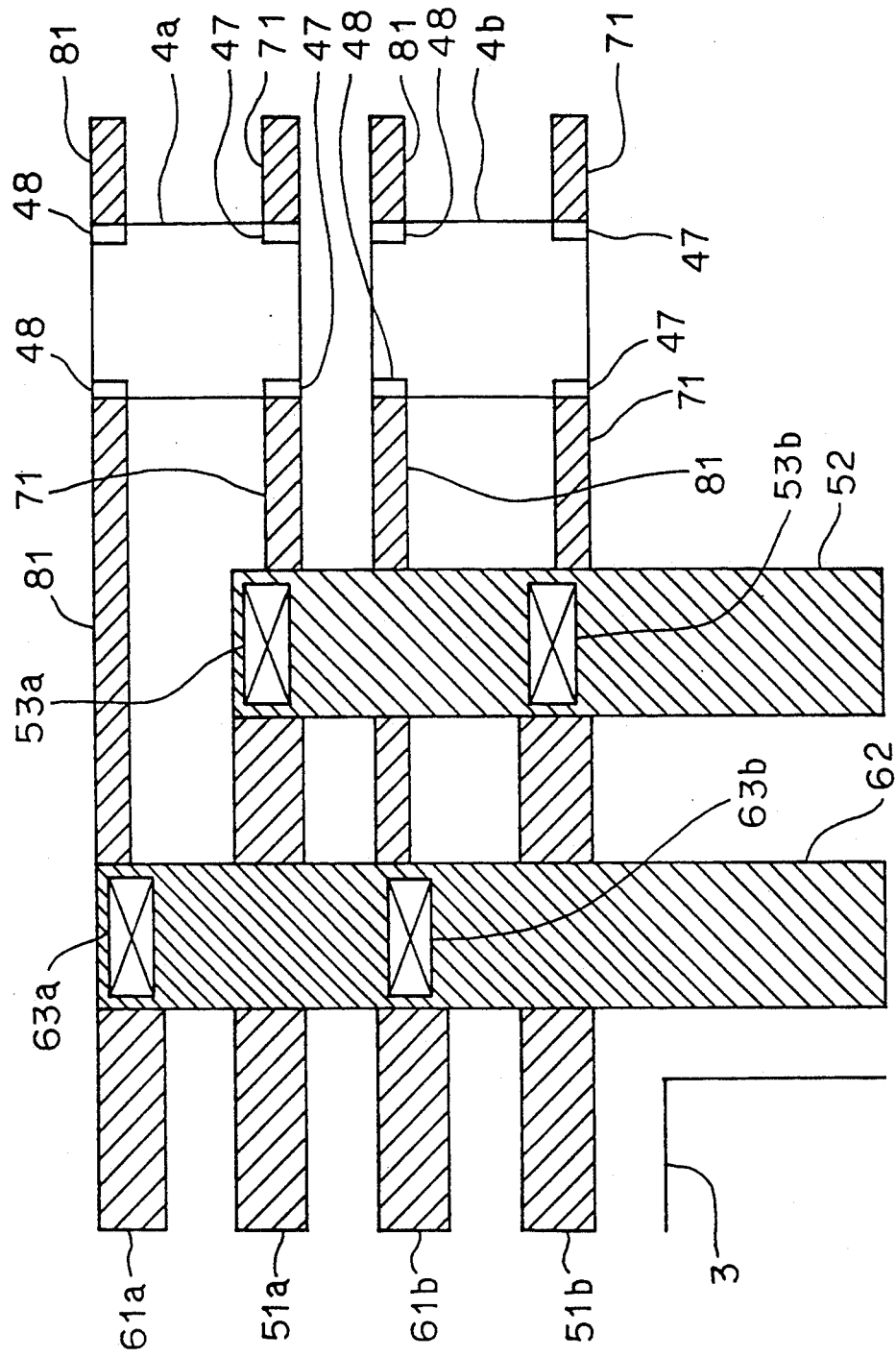
FIG. 10, corresponding to the embodiment of FIG. 8, is a partially enlarged view showing the connection structure of the power supply interconnecting lines at a different place.

FIG. 10 corresponding to the embodiment of FIG. 8 is an enlarged view showing a connection structure of power supply interconnecting lines at a different place. As the connection structure of the power supply interconnecting lines shown in FIG. 10 is the same as that of FIG. 8, the description thereof will not be repeated here.

Figure 11:
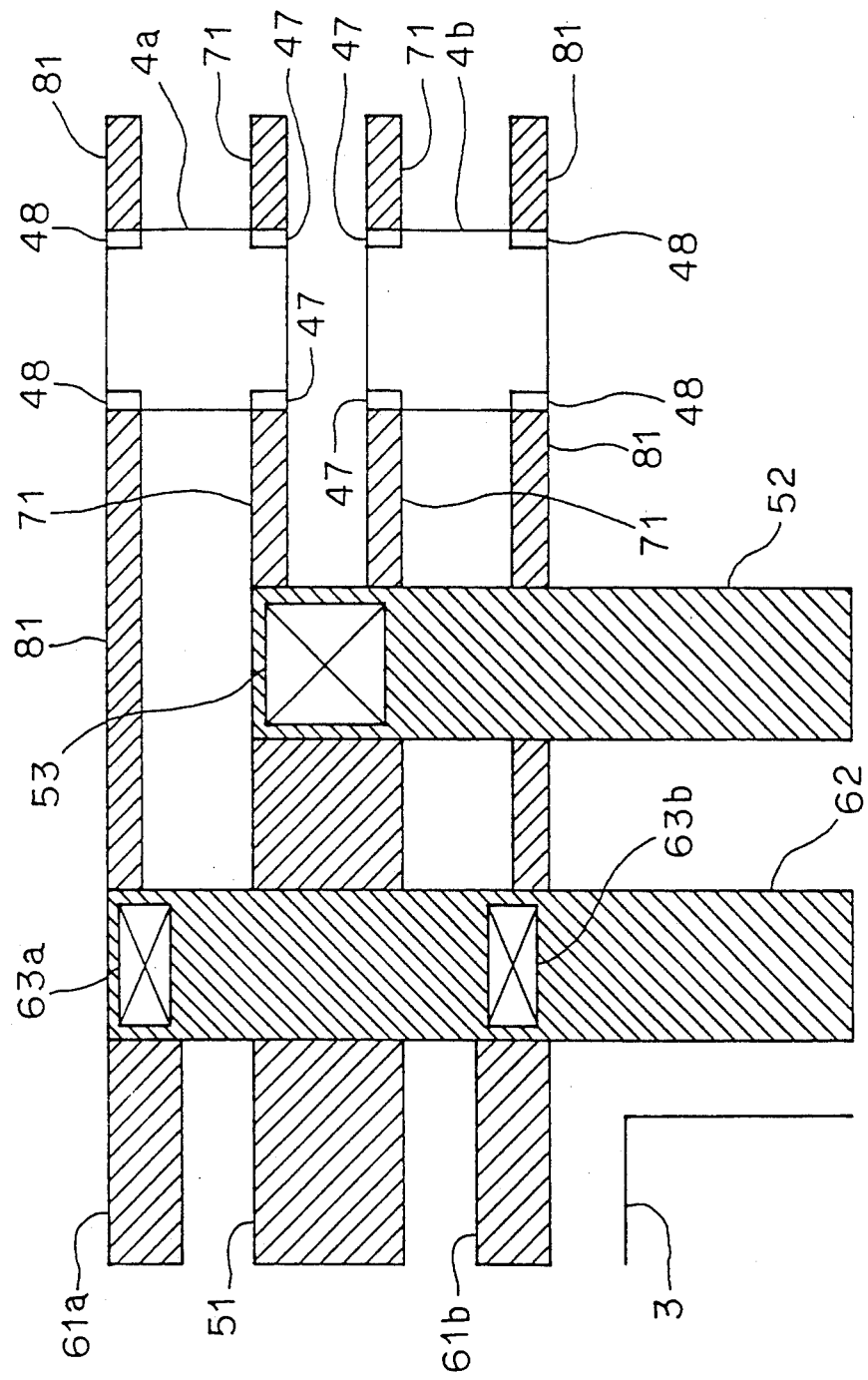
FIG. 11, corresponding to the embodiment of FIG. 9, is a partially enlarged view showing the connection structure of the power supply interconnecting lines at a different place.

FIG. 11 corresponding to the embodiment of FIG. 9 is an enlarged view showing a connection structure of power supply interconnecting lines at a different place. Since the connection structure of the power supply interconnecting lines shown in FIG. 11 is the same as that shown in FIG. 9, the description thereof will not be repeated here.

Figure 12:
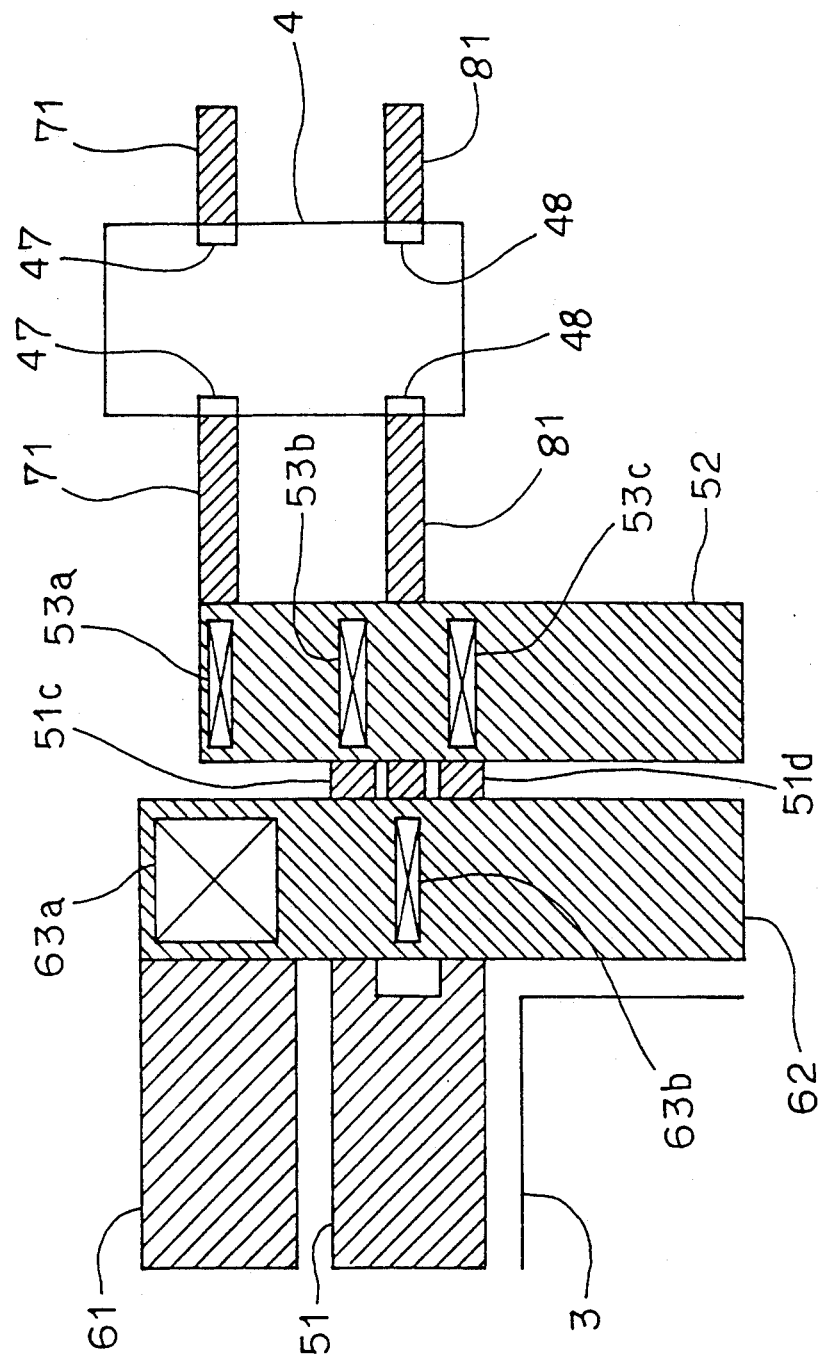
FIG. 12 is a partially enlarged view showing a connection structure of power supply interconnecting lines in accordance with a second embodiment of the present invention.

FIG. 12 is an enlarged view of a connection structure of power supply interconnecting lines in another embodiment. As shown in FIG. 12, a first VDD annular interconnecting line 51 includes two branched first VDD annular interconnecting line portions 51c and 51d. The first VDD annular interconnecting line portion 51c is connected to a second VDD annular interconnecting line 52 through a connection hole 53b. The first VDD annular interconnecting line portion 51d is connected to the second VDD annular interconnecting line 52 through a connection hole 53c. The second VDD annular interconnecting line 52 is so provided as to extend in the longitudinal direction beyond the connection portions with the first VDD annular interconnecting line portions 51c and 51d. The extended portion of the second VDD annular interconnecting line 52 is connected to a VDD terminal 47 of a logic circuit element 4 by a first VDD branch line 71. The first VDD branch line 71 is connected to the second VDD annular interconnecting line 52 through a connection hole 53a. A GND terminal 48 of logic circuit element 4 is connected to a second GND annular interconnecting line 62 by a first GND branch line 81. The first GND branch line 81 is connected to the second GND annular interconnecting line 62 through a connection hole 63b. This connection is made in a region between the two branched first VDD annular interconnecting line portions 51c and 51d. In this way, power supply branch interconnecting lines 71 and 81 can be provided to extend rectilinearly at the connections of each terminal of the logic circuit element and the annular power supply interconnecting lines.

Figure 13:
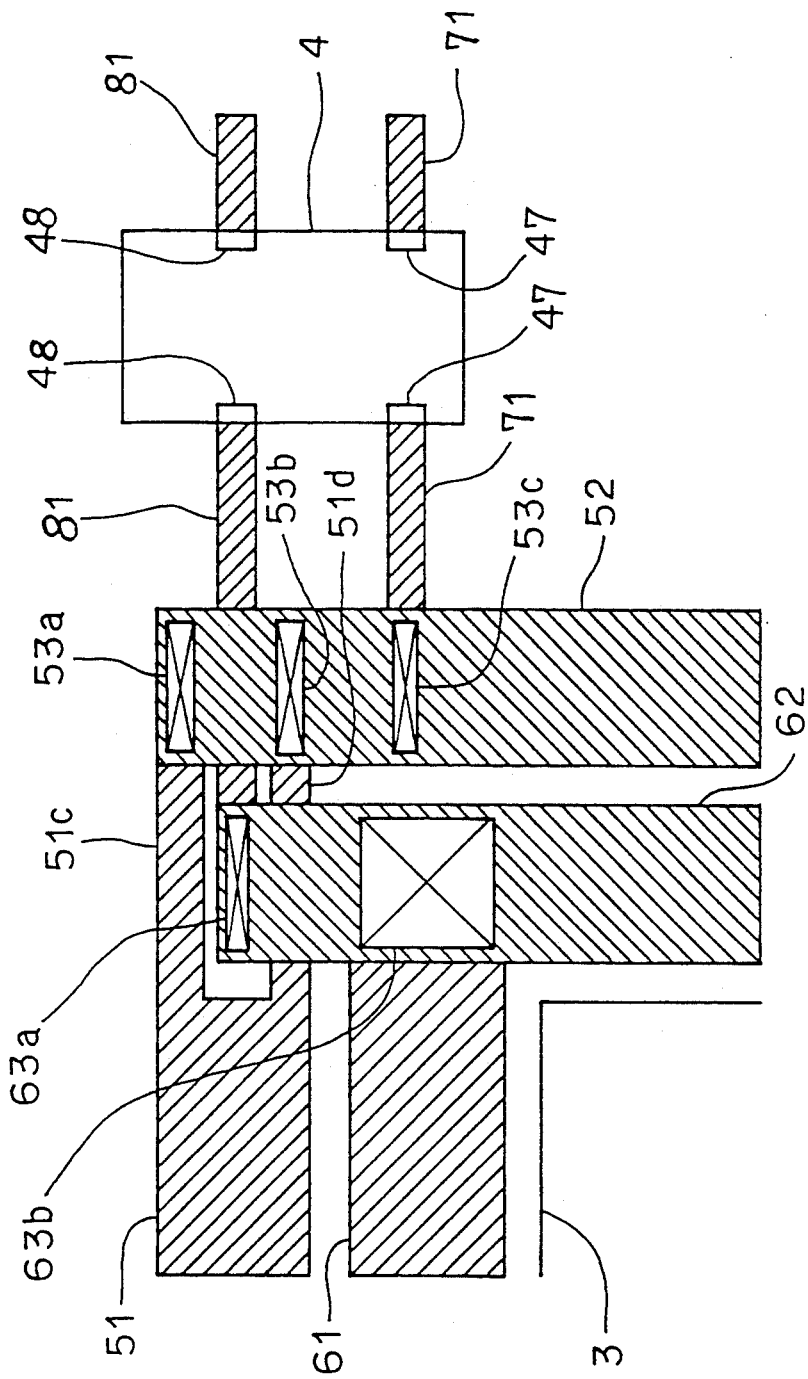
FIG. 13 is a partially enlarged view showing a connection structure of power supply interconnecting lines of another type of the second embodiment, corresponding to FIG. 12.

FIG. 13 is an enlarged view showing a structure where part of an annular power supply interconnecting line is branched in accordance with another embodiment. As shown in FIG. 13, arrangement of VDD terminals 47 and GND terminals 48 of a logic circuit element 4 and arrangement of a first VDD annular interconnecting line 51 and a first GND annular interconnecting line 61 are opposite to those shown in FIG. 12, respectively. Also, in this case, a first VDD branch line 71 and a first GND branch line 81 can be provided rectilinearly by branching only the first VDD annular interconnecting line 51 into two lines.

Figure 14:
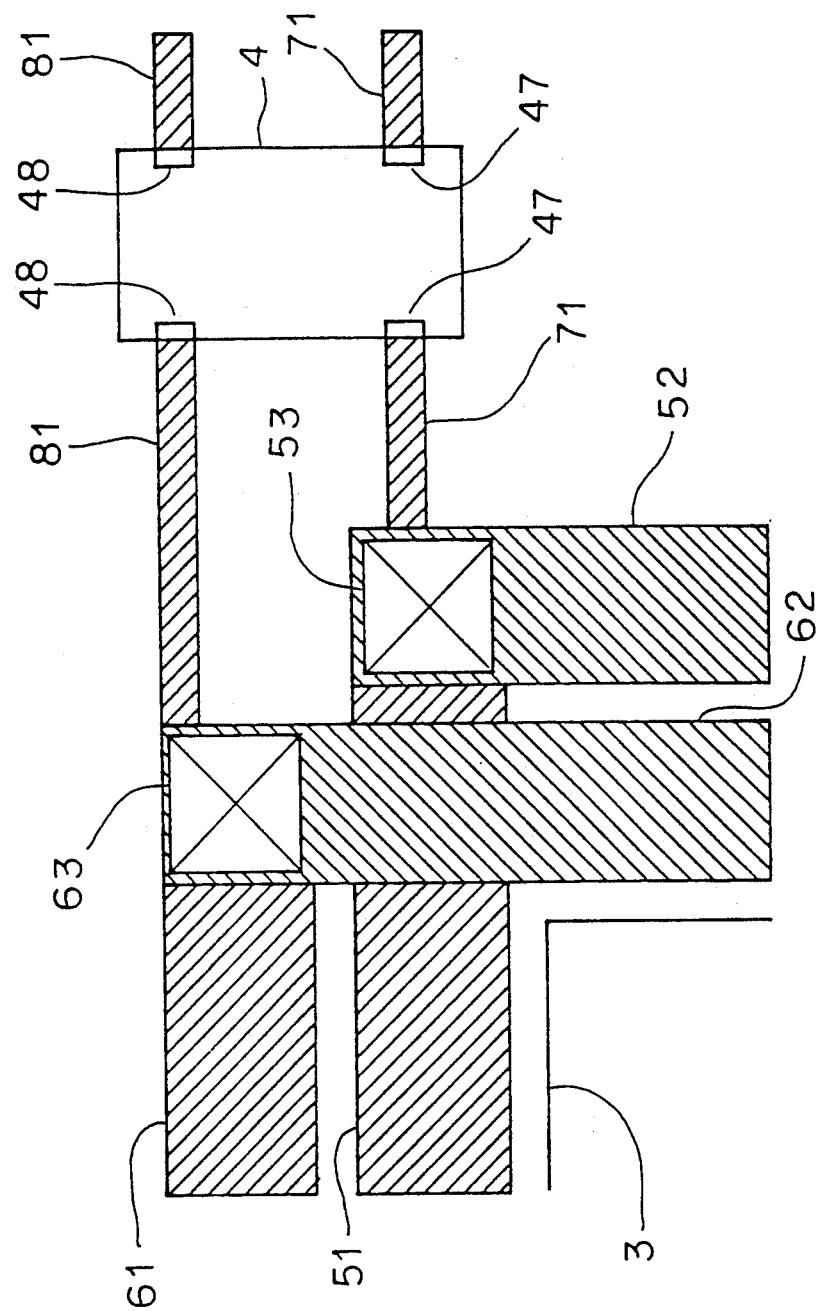
FIG. 14 is a partially enlarged view showing a connection structure of power supply interconnecting lines obtained in one embodiment of a method of designing a layout of a semiconductor integrated circuit device according to the present invention.

FIG. 14 is a partially enlarged view showing arrangement of power supply interconnecting lines in accordance with another embodiment of a method for designing a layout of a semiconductor integrated circuit device in this invention. As shown in FIG. 14, the widths of VDD annular power supply interconnecting lines 51 and 52 and GND annular power supply interconnecting lines 61 and 62 are smaller compared with the height of a logic circuit element 4. In such a case, a VDD terminal 47 and a GND terminal 48 of logic circuit element 4 may be so arranged as to conform to the first VDD annular interconnecting line 51 and the first GND annular interconnecting line 61, respectively, instead of dividing or branching the annular power supply interconnecting lines into a plurality of lines. Accordingly, a first VDD branch line 71 and a first GND branch line 81 can be provided to be aligned with the first VDD annular interconnecting line 51 and the first GND annular interconnecting line 61, respectively. As a result, the first VDD branch line 71 and the first GND branch line 81 can be arranged rectilinearly.

Figure 15:
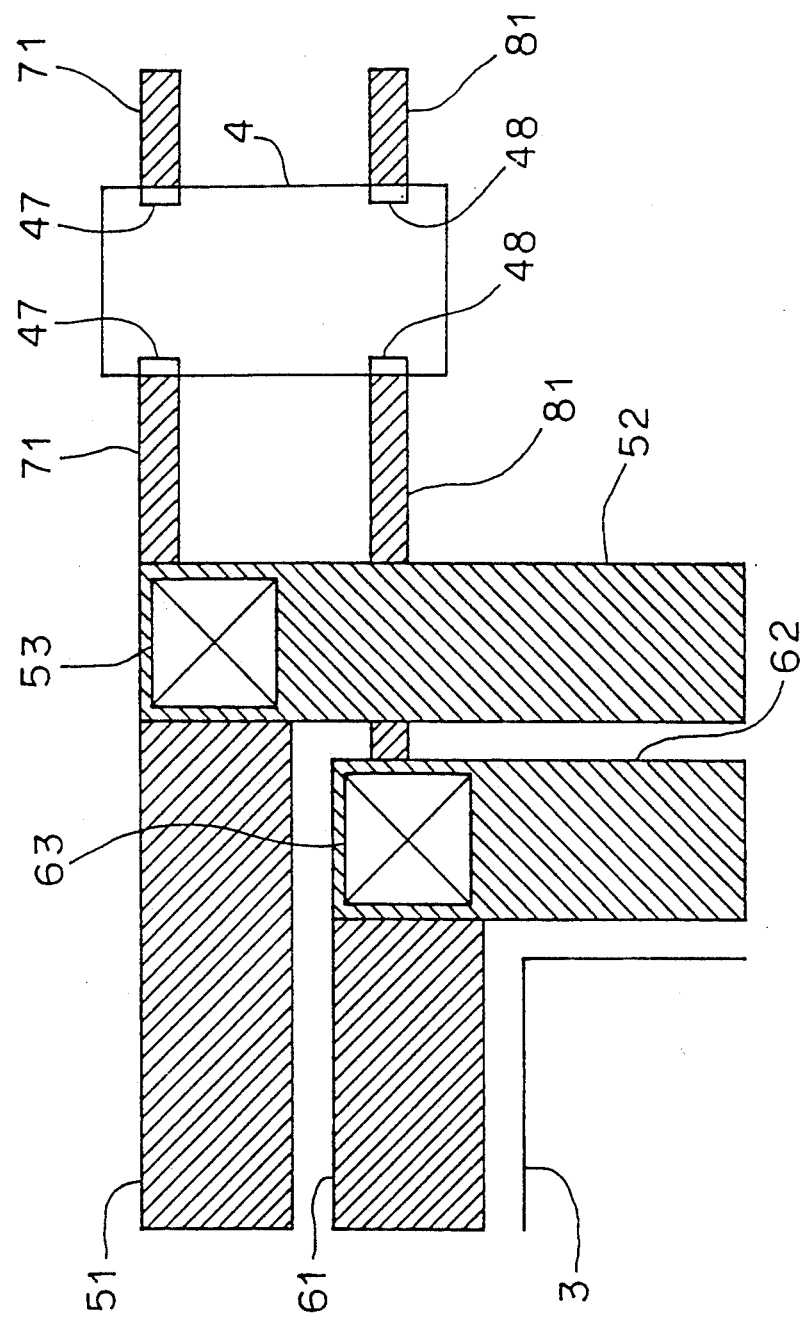
FIG. 15 is a partially enlarged view corresponding to FIG. 14 and showing a connection structure of power supply interconnecting lines obtained in another embodiment of the method of designing a layout of a semiconductor integrated circuit device according to the present invention.

FIG. 15 corresponding to the embodiment of FIG. 14 is a partially enlarged view showing a plane arrangement in a case where arrangement of each terminal of a logic circuit element and annular power supply interconnecting lines is changed. As shown in FIG. 15, arrangement of VDD terminals 47 and GND terminals 48 and arrangement of a first VDD annular interconnecting line 51 and a first GND annular interconnecting line 61 are different from those shown in FIG. 14.

Figure 16:
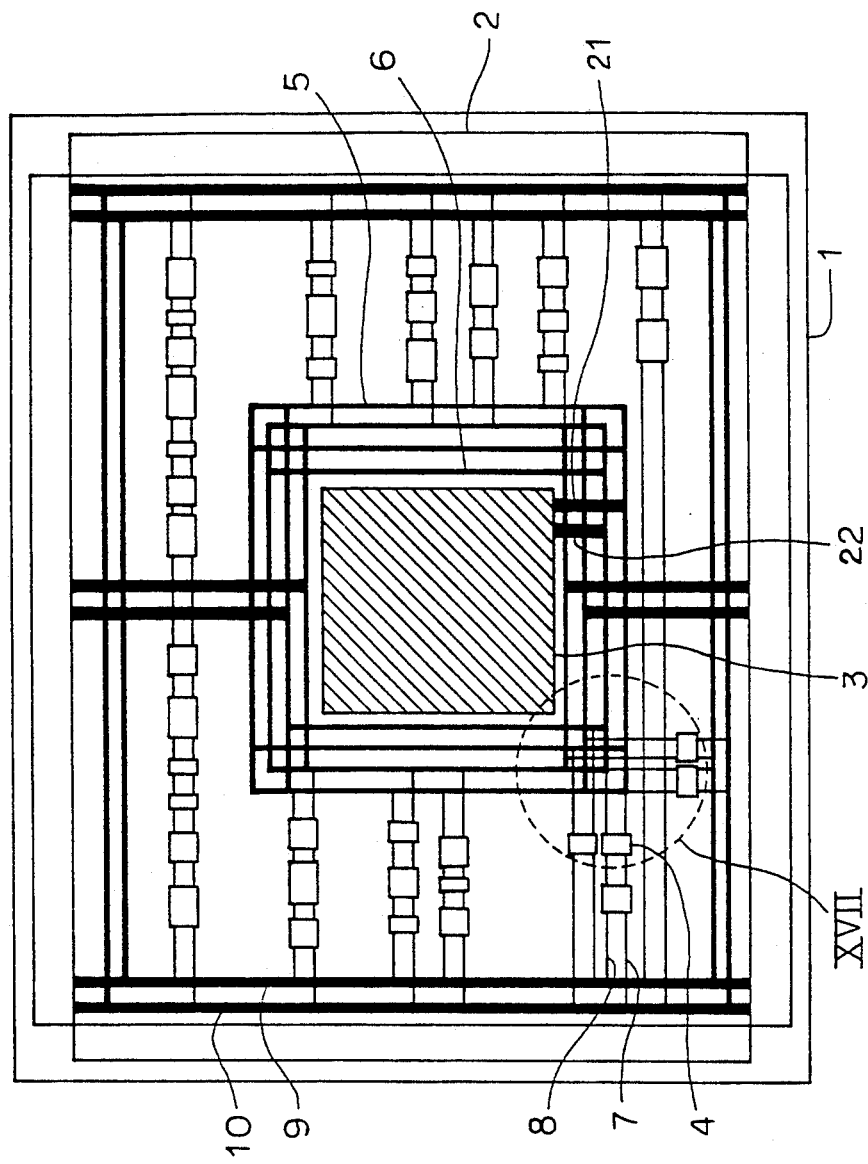
FIG. 16 is a plan view showing an arrangement of a semiconductor integrated circuit device in accordance with a third embodiment of the present invention.
Figure 17:
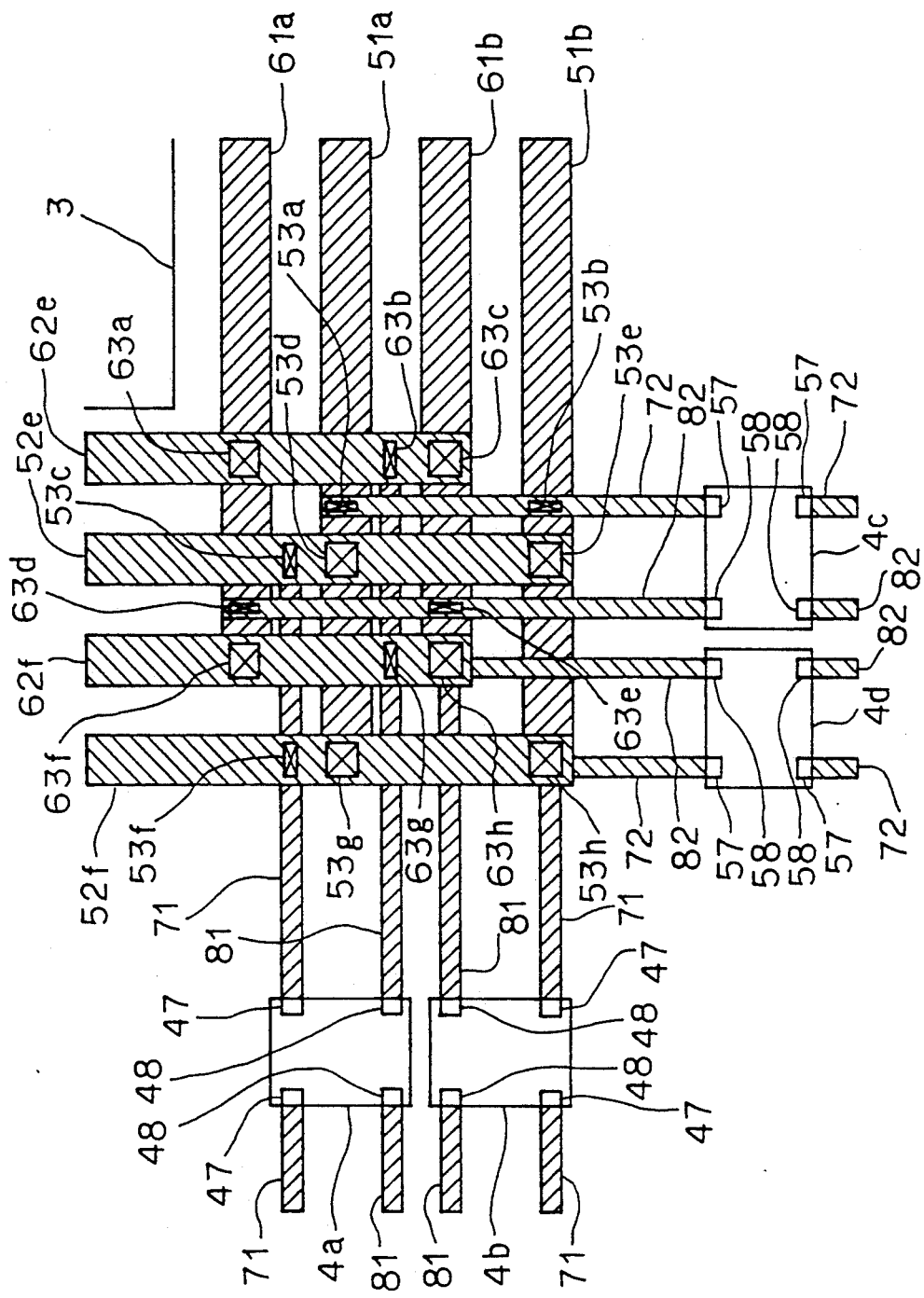
FIG. 17 is a partially enlarged view showing a portion XVII surrounded by the broken line in FIG. 16.

FIG. 16 is a plan view showing still another embodiment of the semiconductor integrated circuit device according to the present invention. FIG. 17 is an enlarged view of a portion XVII surrounded by the broken line in FIG. 16. Referring to FIG. 16, a VDD annular power supply interconnecting line 5 and a GND annular power supply interconnecting line 6 are divided into two lines in both lateral and longitudinal directions. As shown in FIG. 17, VDD annular power supply interconnecting line 5 includes first VDD annular interconnecting lines 51a and 51b and second VDD annular interconnecting lines 52e and 52f. GND annular power supply interconnecting line 6 includes first GND annular interconnecting lines 61a and 61b and second GND annular power supply interconnecting lines 62e and 62f. The first VDD annular interconnecting line 51a is electrically connected to the second VDD annular interconnecting lines 52e and 52f through connection holes 53d and 53g, respectively. The first VDD annular interconnecting line 51b is electrically connected to the second VDD annular interconnecting lines 52e and 52f through connection holes 53e and 53h, respectively. The first GND annular interconnecting line 61a is electrically connected to the second GND annular interconnecting lines 62e and 62f through connection holes 63a and 63f, respectively. The first GND annular interconnecting line 61b is electrically connected to the second GND annular interconnecting lines 62e and 62f through connection holes 63c and 63h, respectively.

A VDD terminal 47 of a logic circuit element 4a is connected to the second VDD annular interconnecting lines 52e and 52f by a first VDD branch line 71. The first VDD branch line 71 is electrically connected to the second VDD annular interconnecting lines 52e and 52f through connection holes 53c and 53f, respectively. A GND terminal 48 of logic circuit element 4a is connected to the second GND annular interconnecting lines 62e and 62f by a first GND branch line 81. The first GND branch line 81 is electrically connected to the second GND annular interconnecting lines 62e and 62f through connection holes 63b and 63g, respectively. A GND terminal 48 of a logic circuit element 4b is connected to the first GND annular interconnecting line 61b by the first GND branch line 81. A VDD terminal 47 of logic circuit element 4b is connected to the first VDD annular interconnecting line 51b by the first VDD branch line 71.

A VDD terminal 57 of a logic circuit element 4c is connected to the first VDD annular interconnecting lines 51a and 51b by a second VDD branch line 72. The second VDD branch line 72 includes a second interconnection layer and extends in the longitudinal direction. The second VDD branch line 72 is electrically connected to the first VDD annular interconnecting lines 51a and 51b through connection holes 53a and 53b. A GND terminal 58 of logic circuit element 4c is connected to the first GND annular interconnecting lines 61a and 61b by a second GND branch line 82. The second GND branch line 82 includes the second interconnection layer and extends in the longitudinal direction. The second GND branch line 82 is electrically connected to the first GND annular interconnecting lines 61a and 61b through connection holes 63d and 63e, respectively. A GND terminal 58 of a logic circuit element 4d is connected to the second GND annular interconnecting line 62f by the second GND branch line 82. A VDD terminal 57 of logic circuit element 4d is connected to the second VDD annular interconnecting line 52f by the second VDD branch line 72.

Both of the power supply branch interconnecting lines extending in the lateral and longitudinal directions can be so provided as to extend rectilinearly by dividing both of the annular power supply interconnecting lines extending in the longitudinal and lateral directions into a plurality of lines.

Figure 18:
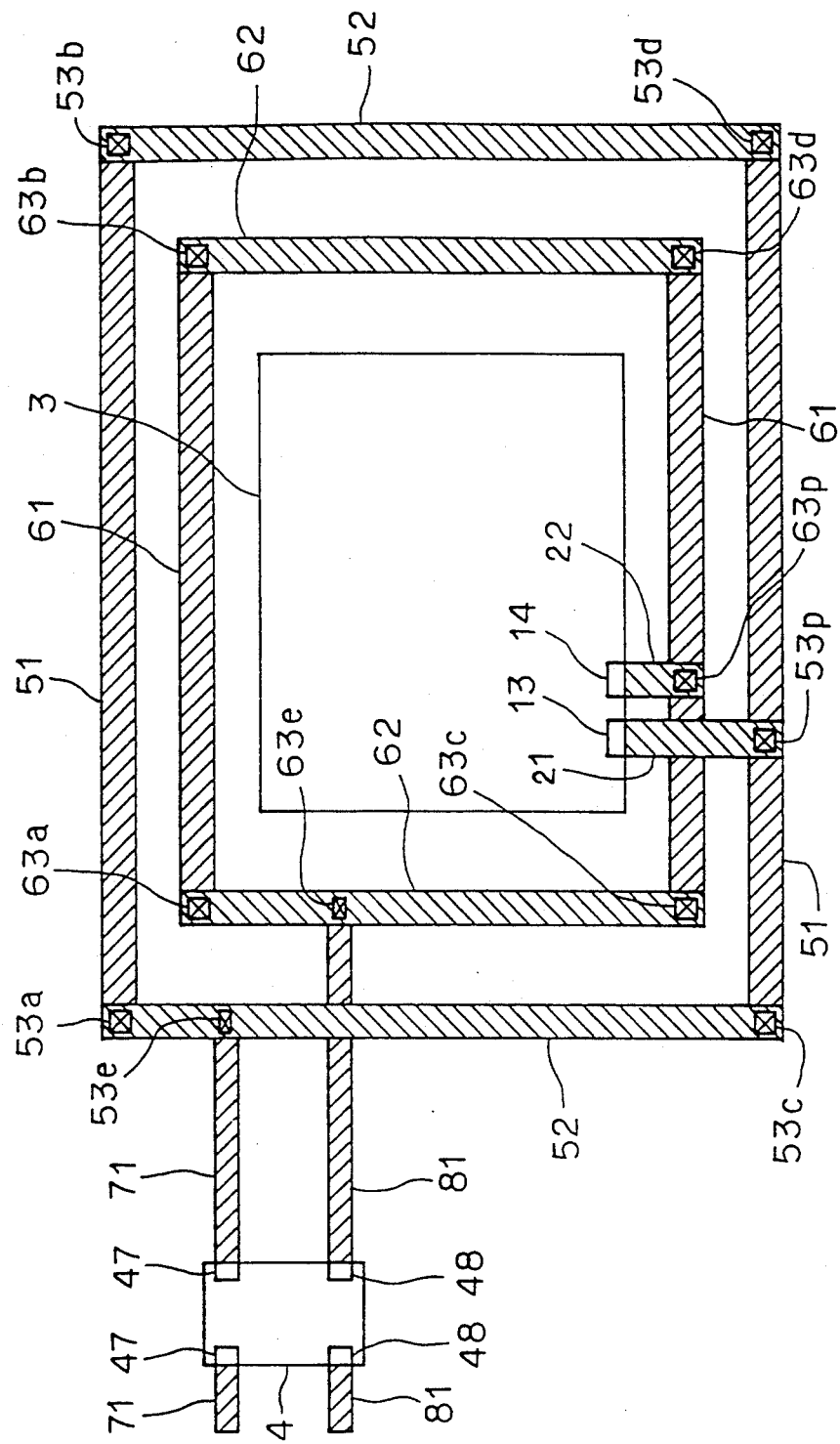
FIG. 18 is a schematic plan view showing an arrangement of a semiconductor integrated circuit device in accordance with a fourth embodiment of the present invention.

FIG. 18 is a schematic plan view showing a connection structure of a large scale circuit block and annular power supply interconnecting lines in accordance with one embodiment of the present invention. Referring to FIG. 18, a VDD terminal 13 of a large scale circuit block 3 is connected to a first VDD annular interconnecting line 51 by a VDD connecting line 21. A GND terminal 14 of large scale circuit block 3 is connected to a first GND annular interconnecting line 61 by a GND connecting line 22. VDD connecting line 21 includes a second interconnection layer and is electrically connected to the first VDD annular interconnecting line 51 through a connection hole 53p. GND connecting line 22 includes the second interconnection layer and is connected to the first GND annular interconnecting line 61 through a connection hole 63p.

A VDD terminal 47 of a logic circuit element 4 is connected to a second VDD annular interconnecting line 52 by a first VDD branch line 71. A GND terminal 48 of logic circuit element 4 is connected to a second GND annular interconnecting line 62 by a first GND branch line 81. The first VDD branch line 71 is electrically connected to the second VDD annular interconnecting line 52 through a connection hole 53e. The first GND branch line 81 is electrically connected to the second GND annular interconnecting line 62 through a connection hole 63e.

VDD and GND connecting lines 21 and 22 extend in the longitudinal direction. Conversely, the first VDD branch line 71 and the first GND branch line 81 extend in the lateral direction. Accordingly, connecting lines 21 and 22 can be so provided as to extend rectilinearly at the connections of large scale circuit block 3 and the annular power supply interconnecting lines.

Figure 19:
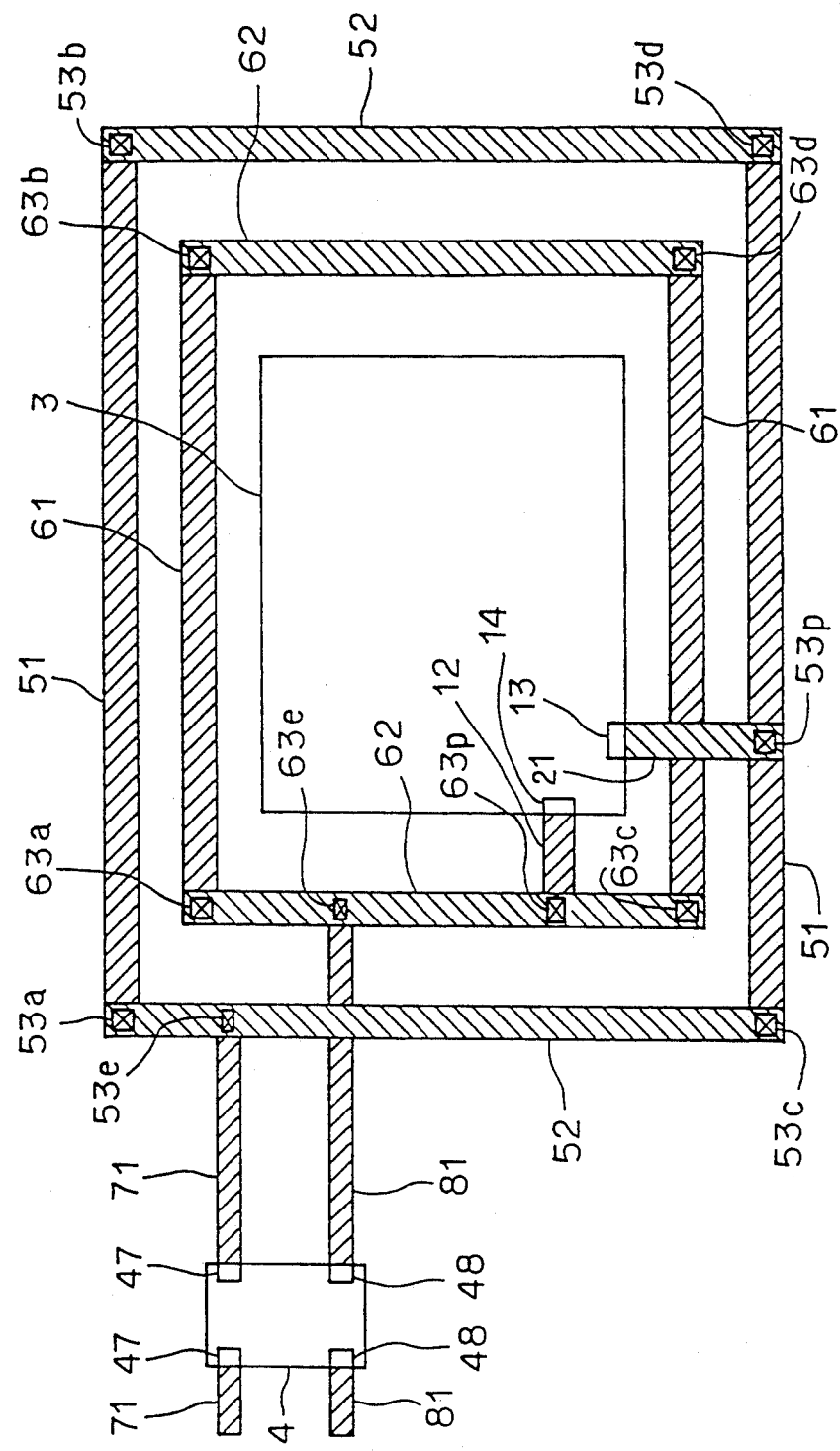
FIG. 19 is a schematic plan view corresponding to FIG. 18 and showing another type of the fourth embodiment of the present invention.
Figure 20:
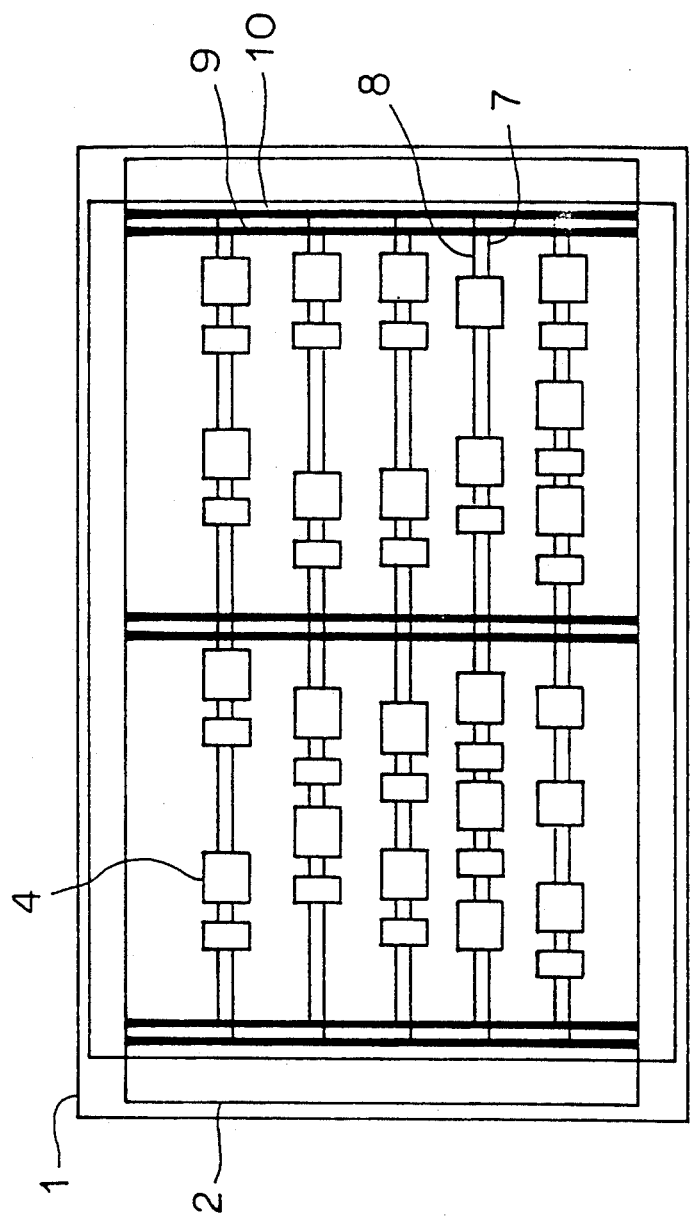
FIG. 20 is a plan view showing an arrangement of a semiconductor integrated circuit device including only logic circuit elements of the same height obtained in accordance with a conventional standard cell method.
Figure 21:
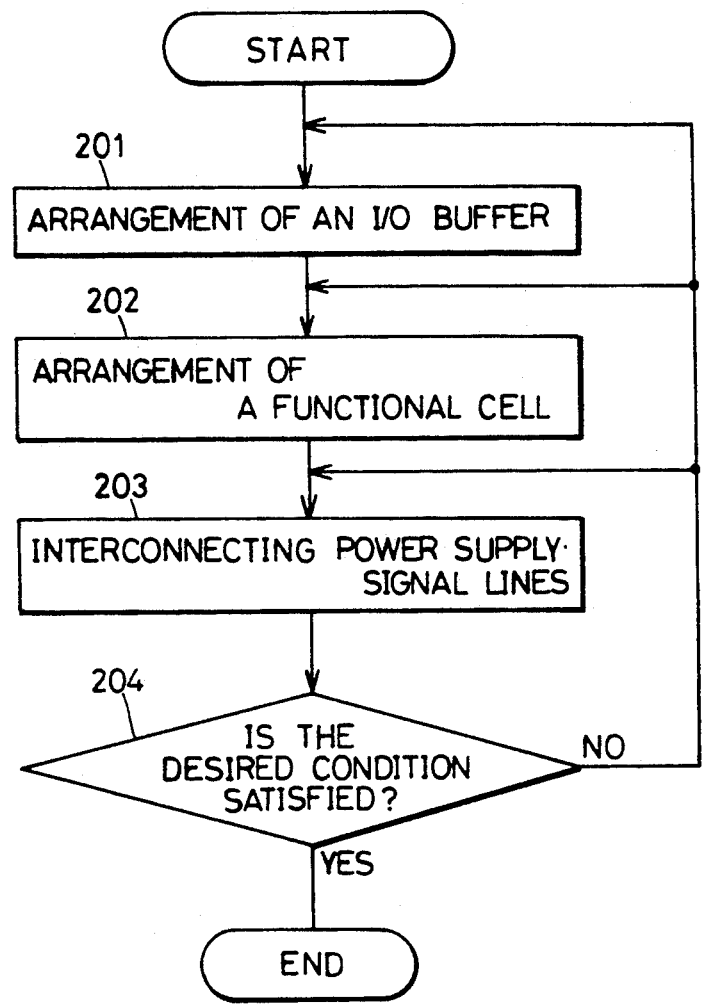
FIG. 21 is a flow chart showing a method of designing a layout of a conventional semiconductor integrated circuit device.
Figure 22:
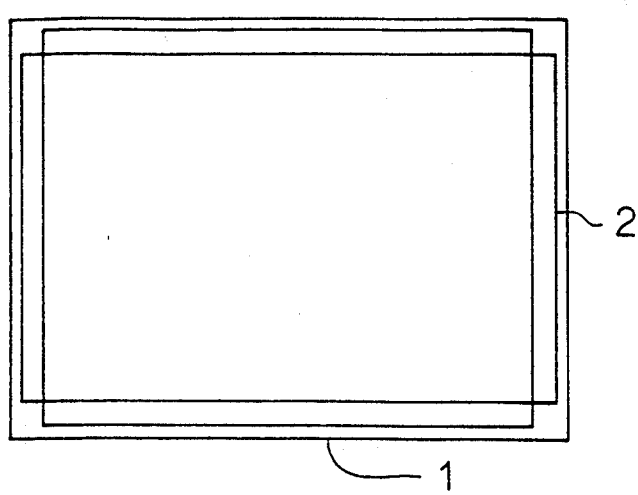
FIG. 22 is a plan view showing an arrangement according to first process of a method of designing a layout of a conventional semiconductor integrated circuit device.
Figure 23:
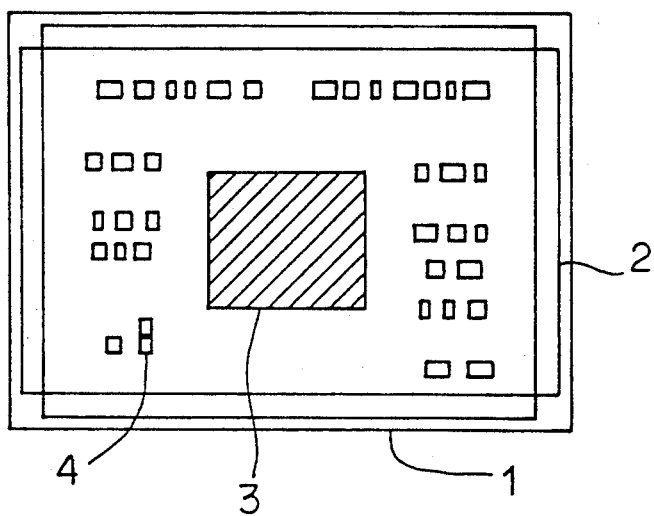
FIG. 23 is a plan view showing an arrangement according to second process of the method of designing the layout of the conventional semiconductor integrated circuit device.
Figure 24:
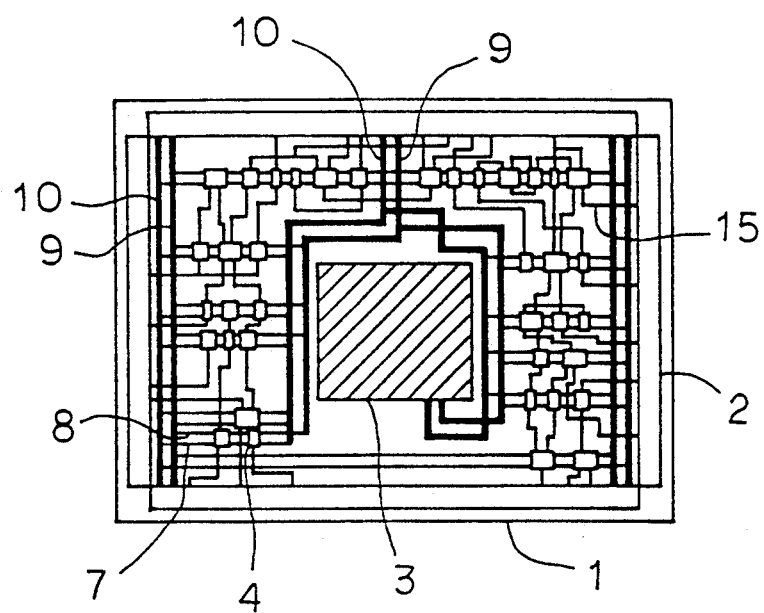
FIG. 24 is a plan view showing an arrangement according to third process of the method of designing the layout of the conventional semiconductor integrated circuit device.
Figure 25:
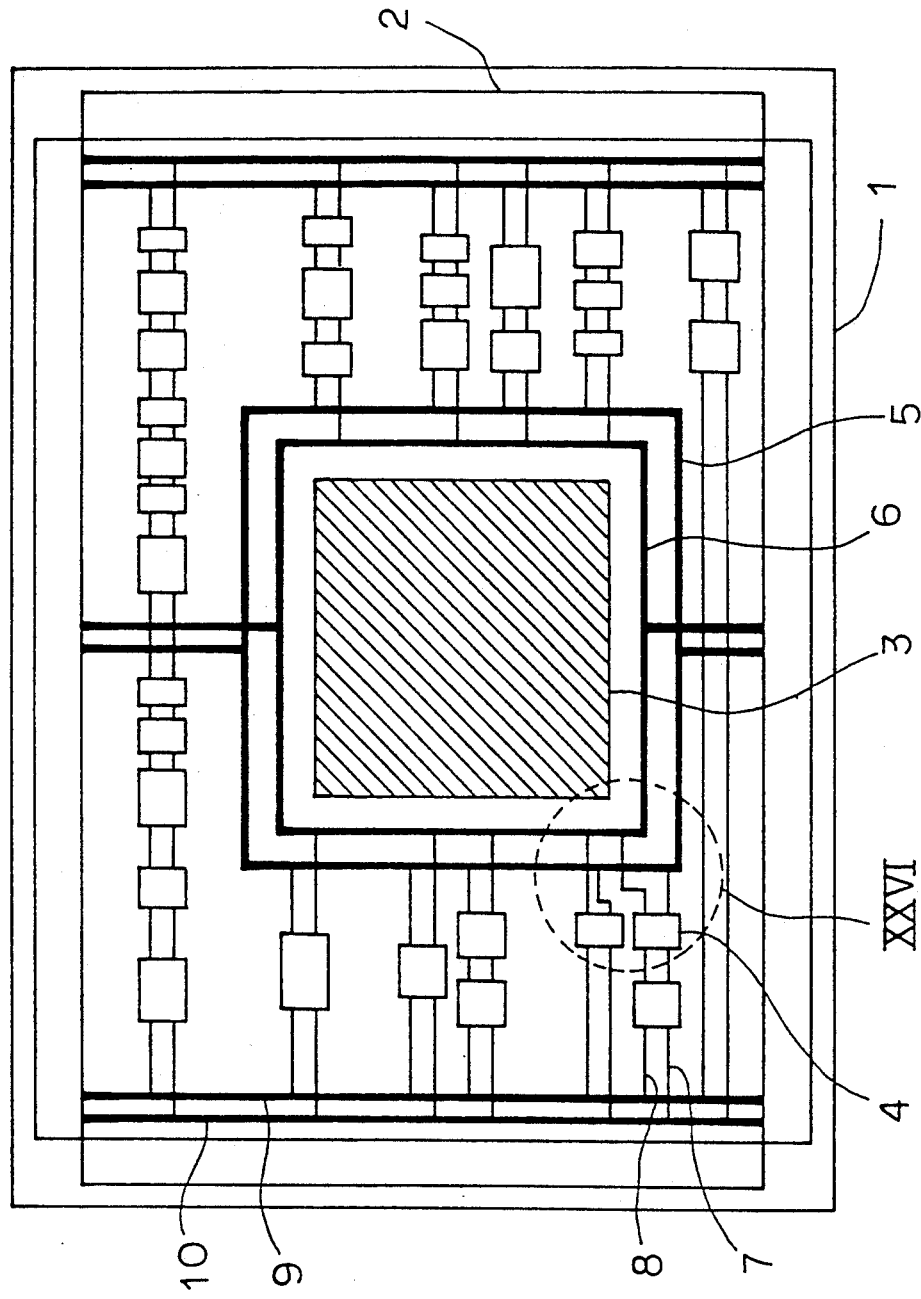
FIG. 25 is a plan view showing an example of an arrangement of a conventional semiconductor integrated circuit device.
Figure 26:
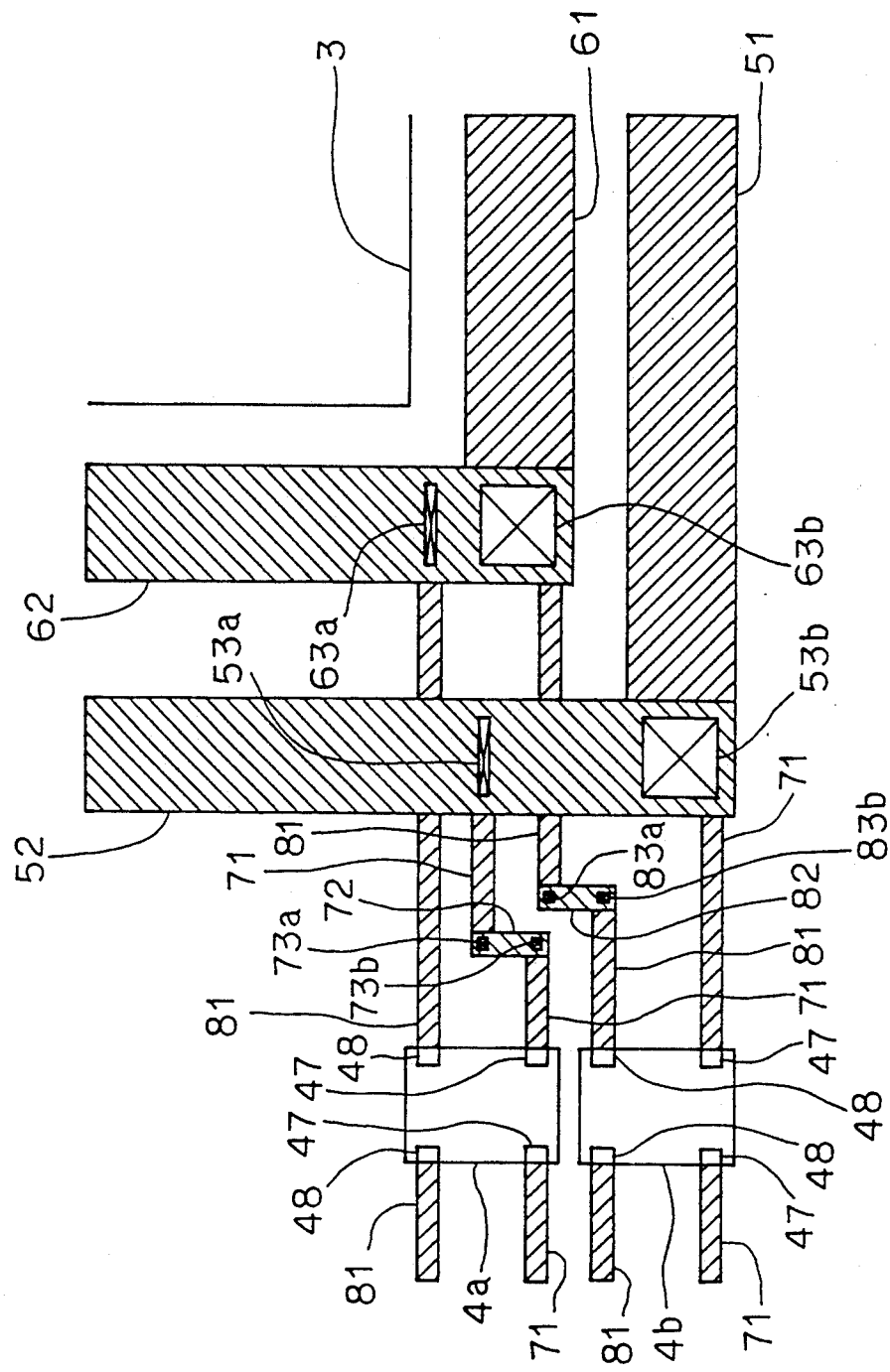
FIG. 26 is a partially enlarged view showing a portion XXVI surrounded by the broken line in FIG. 25.
Figure 27:
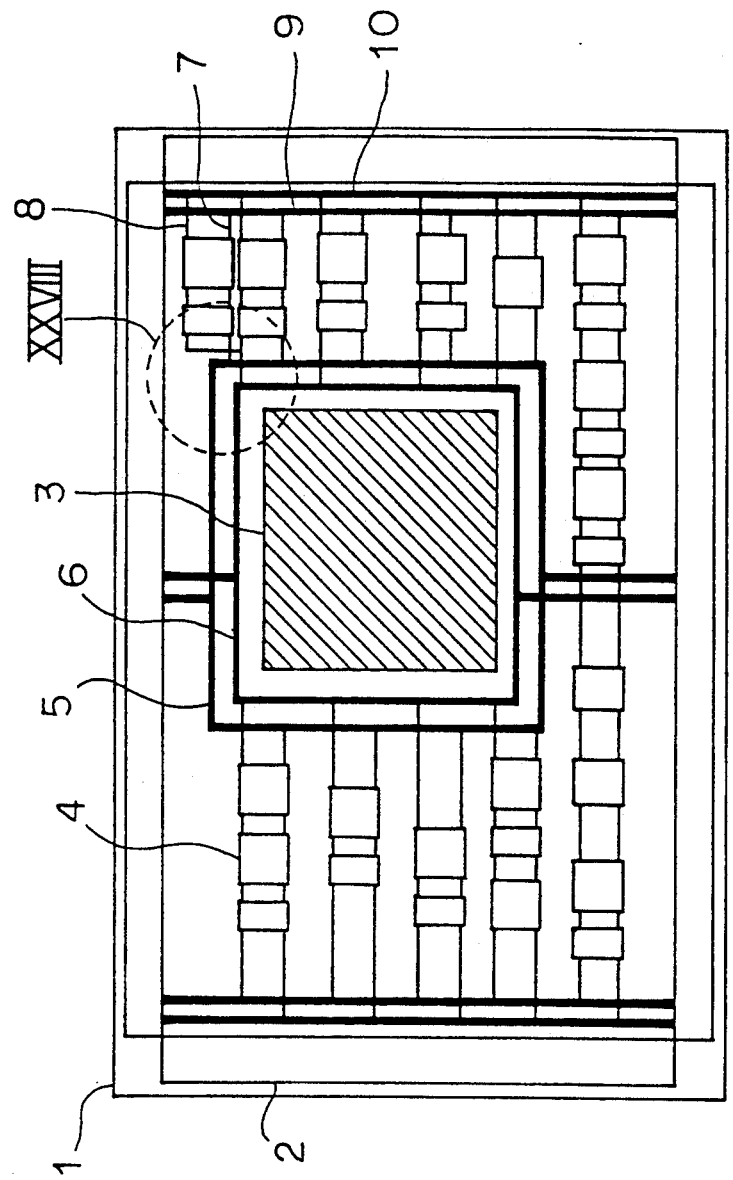
FIG. 27 is a plan view showing another example of an arrangement of the conventional semiconductor integrated circuit device.
Figure 28:
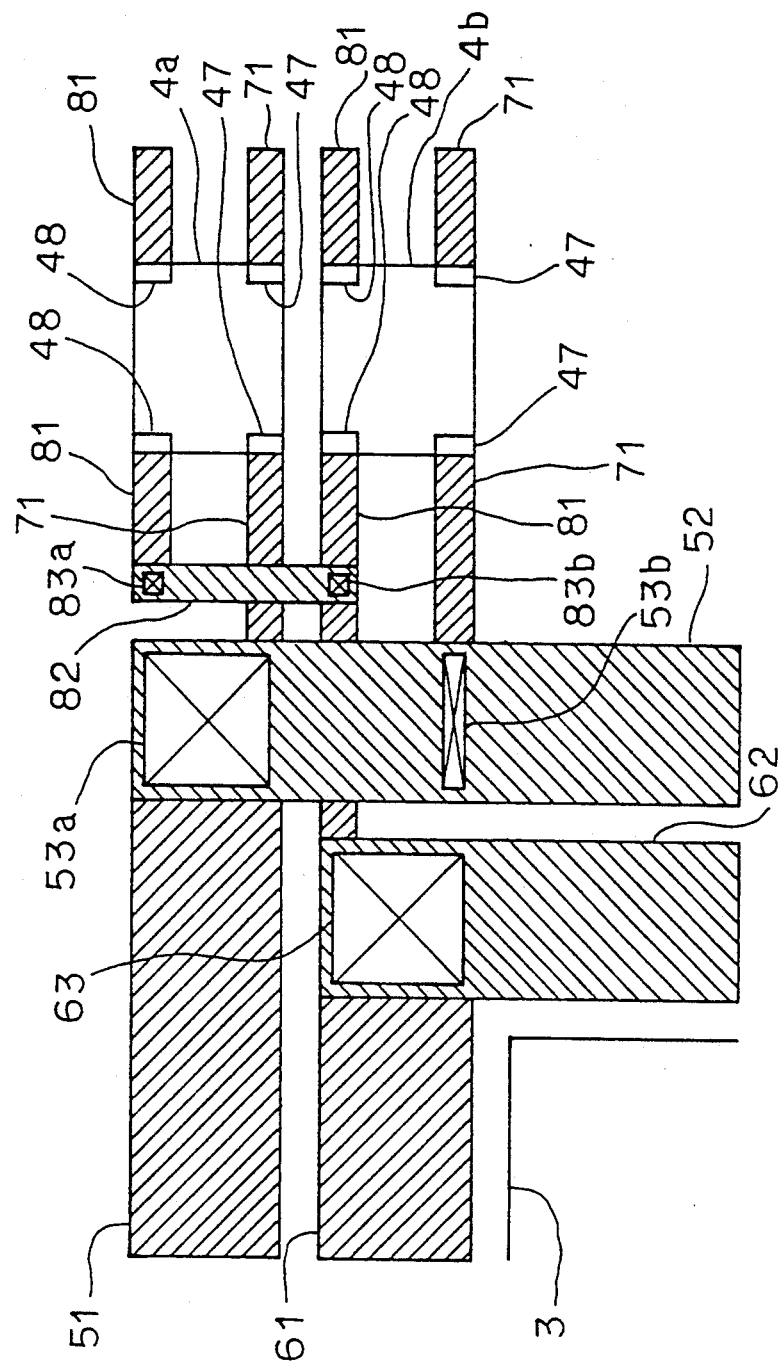
FIG. 28 is a partially enlarged view showing a portion XXVIII surrounded by the broken line in FIG. 27.
Figure 29:
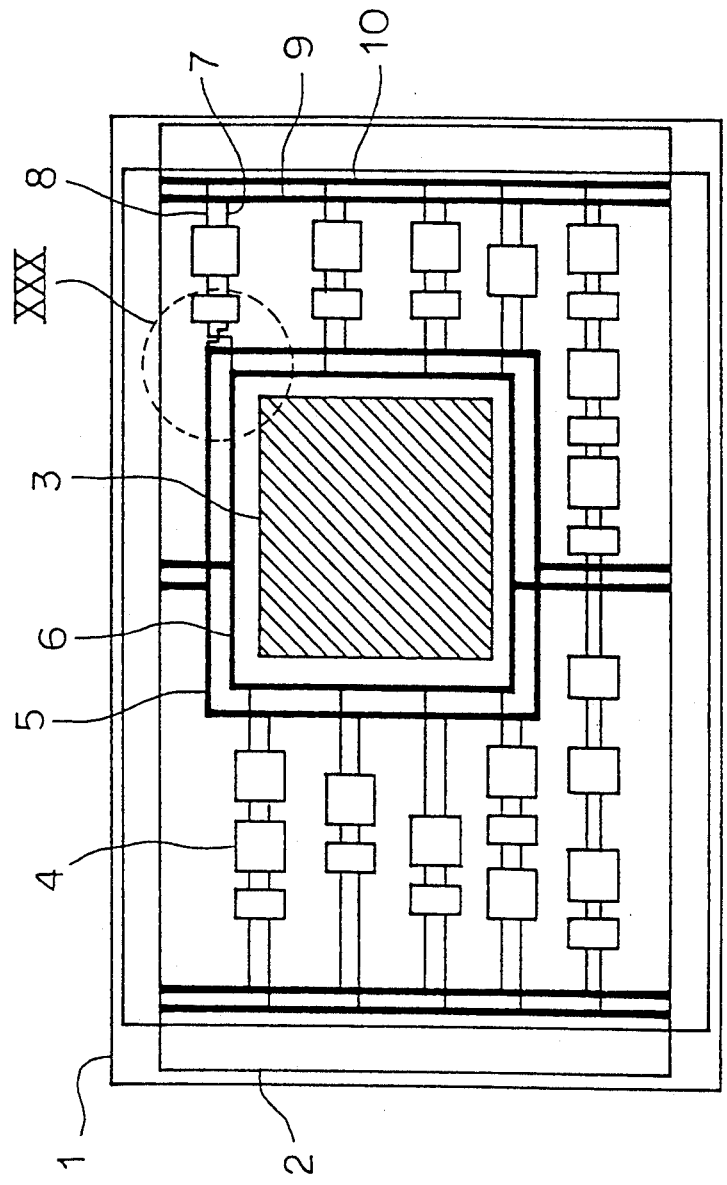
FIG. 29 is a plan view showing still another example of an arrangement of the conventional semiconductor integrated circuit device.
Figure 30:
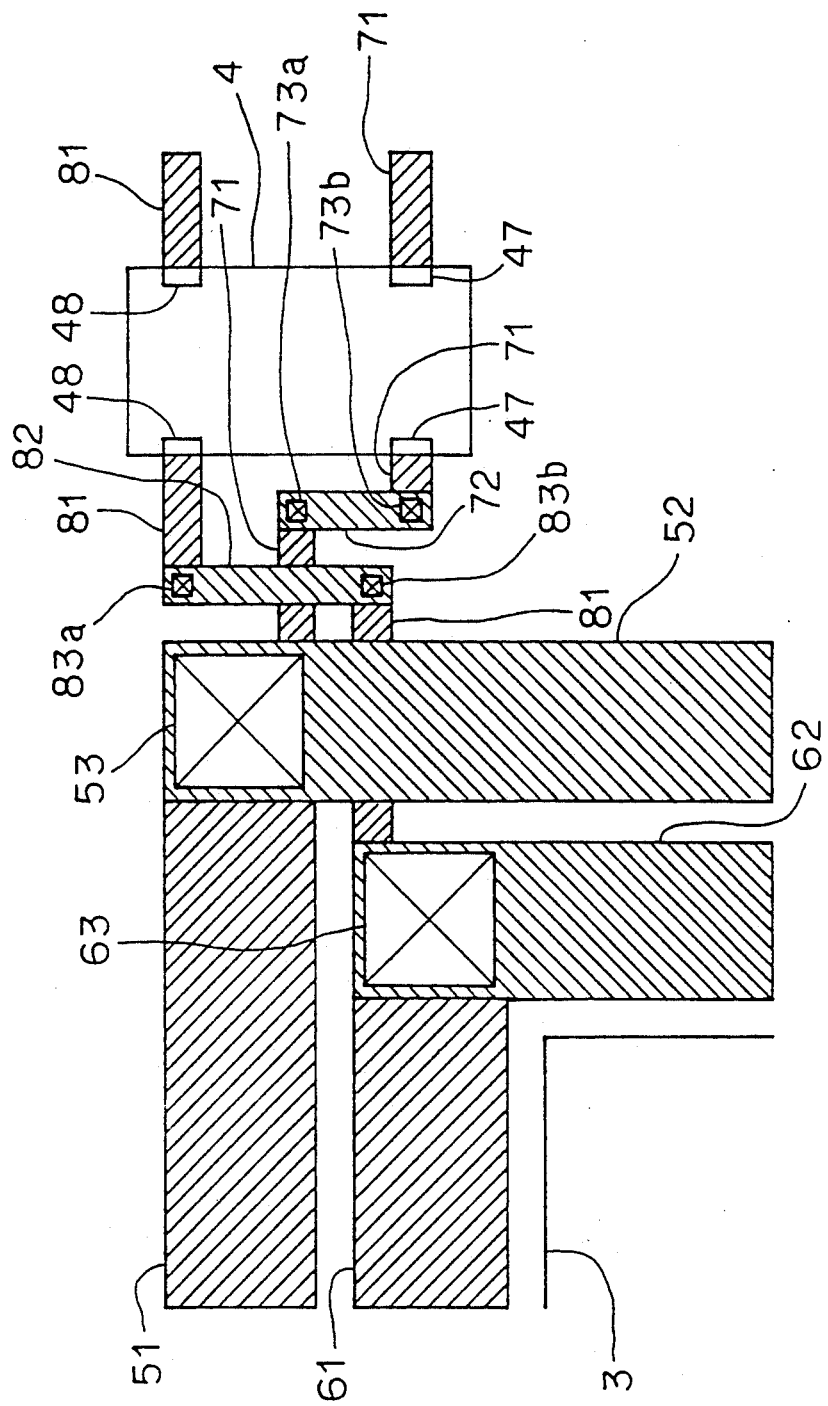
FIG. 30 is a partially enlarged view showing a portion XXX surrounded by the broken line in FIG. 29.
Figure 31:
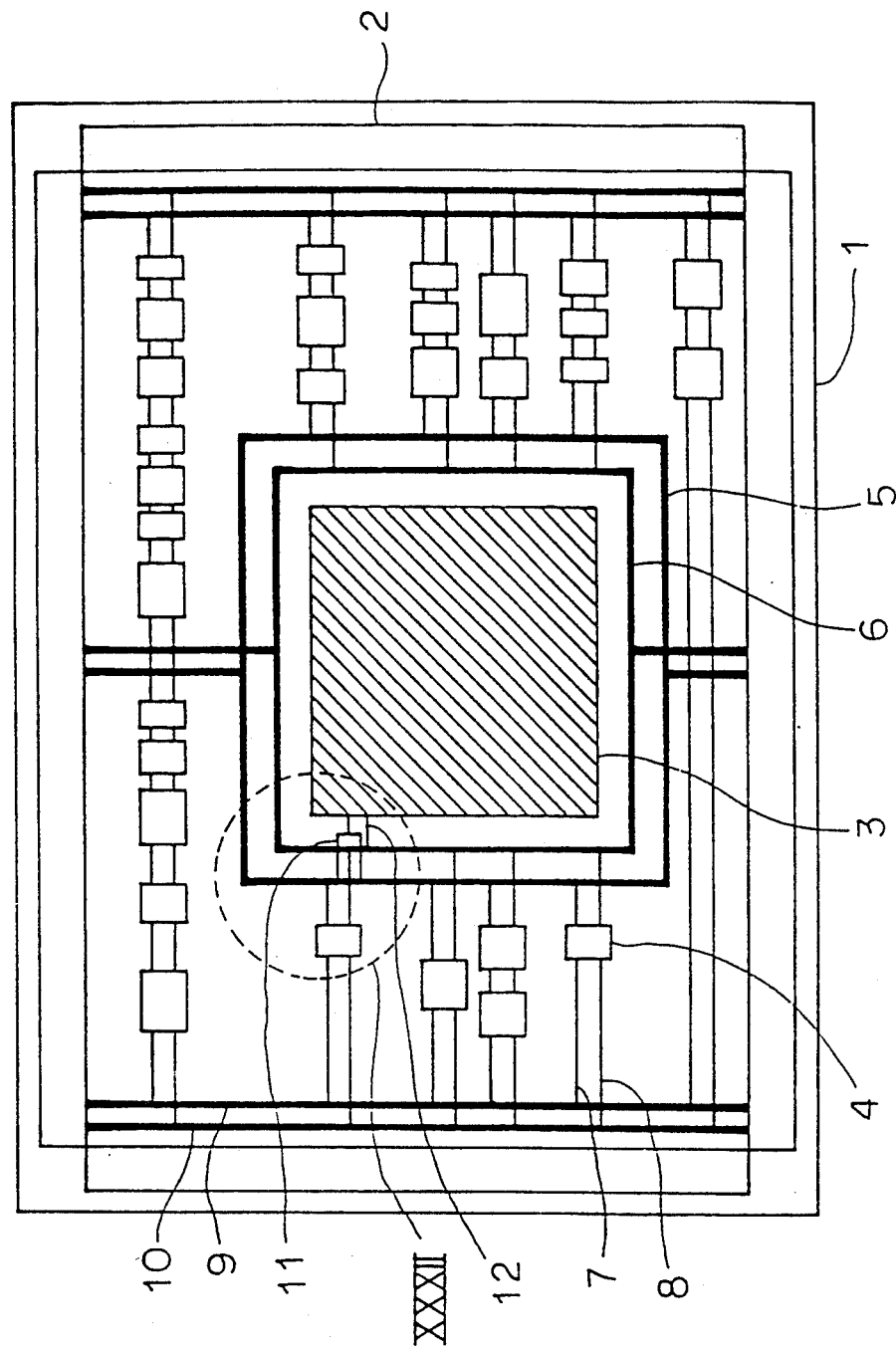
FIG. 31 is a plan view showing still another example of an arrangement of the conventional semiconductor integrated circuit device.
Figure 32:
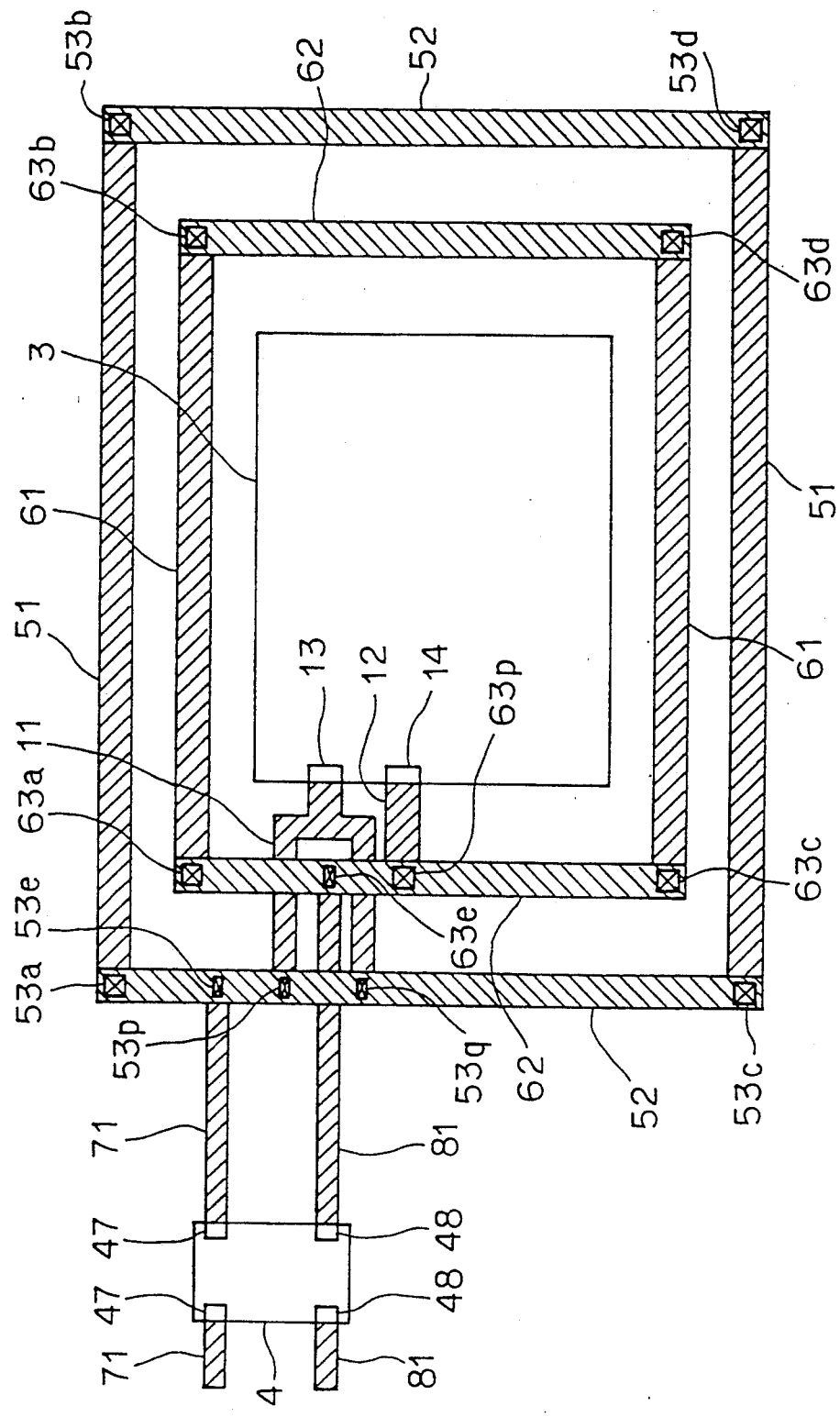
FIG. 32 is a partially enlarged view showing a portion XXXII surrounded by the broken line in FIG. 31.

FIG. 19 is a schematic plan view showing a connection structure of a large scale circuit block and annular power supply interconnecting lines in accordance with another embodiment. As shown in FIG. 19, only a VDD connecting line 21 extends in the longitudinal direction. In this way, only VDD connecting line 21 for connecting a first VDD annular interconnecting line 51 located outside with a VDD terminal 13 of a large scale circuit block 3 may be so provided as to extend in a direction different from a direction in which a first VDD branch line 71 and a first GND branch line 81 extend. Accordingly, the connecting line can be provided rectilinearly at the connection of the annular power supply interconnecting line located outside and the large scale circuit block.

As described above, in accordance with the present invention, power supply connecting lines to be connected to annular power supply lines can be provided rectilinearly. Accordingly, an area occupied by the power supply connecting lines can be reduced. Additionally, as the interconnection length of the power supply connecting lines is shortened, the interconnection impedance can be lowered. As a result, the power supply noise can be reduced. Furthermore, as the power supply connecting lines are integrated into a simple rectilinear and structure over the entire semiconductor integrated circuit device, automation of layout and interconnection in designing the layout can be easily achieved.

Because of the facts described above, a semiconductor integrated circuit device of a high performance and improved function can be obtained in a short period of time.

Although the present invention has been described and illustrated in detail, it is clearly understood that the same is by way of illustration and example only and is not to be taken by way of limitation, the spirit and scope of the present invention being limited only by the terms of the appended claims.

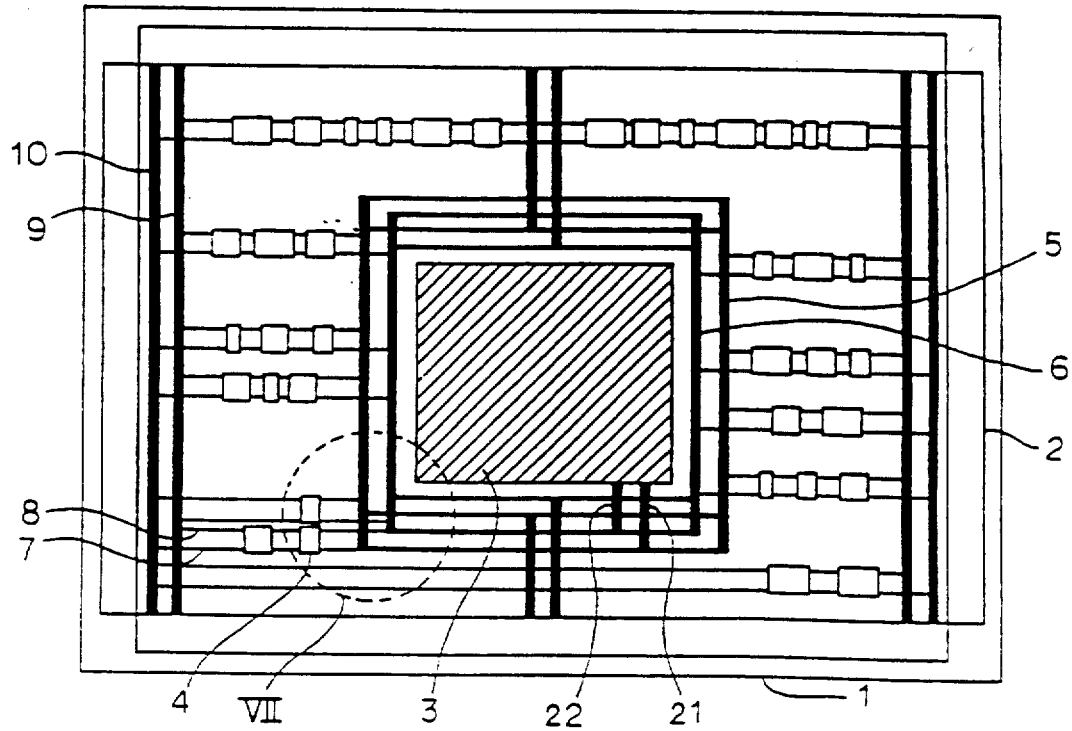

What is claimed is:

1. A semiconductor integrated circuit device having a plurality of logic circuit blocks of different sizes which are designed in advance on a logical function basis, comprising:
   a first logic circuit block provided on a substrate;
   a second logic circuit block being smaller than said first logic circuit block and provided on said substrate;
   an annular power supply line including a first power supply line extending in a first direction and a second power supply line extending in a second direction crossing said first direction and connected to said first power supply line, and so provided on said substrate as to surround said first logic circuit block,
   said first power supply line including an interconnecting line portion extending in said first direction and divided into a plurality of lines; and
   a power supply connecting line so provided on said substrate as to connect said second logic circuit block to said annular power supply line and to extend in said first direction.

2. The semiconductor integrated circuit device according to claim 1, wherein said annular power supply line comprises
   a first potential supply line for providing a first potential, and
   a second potential supply line for providing a second potential that is higher than said first potential.

3. The semiconductor integrated circuit device according to claim 2, wherein at least either of said first and second potential supply lines comprises an interconnecting line portion divided into a plurality of lines.

4. The semiconductor integrated circuit device according to claim 2, wherein said power supply connecting line comprises
   a first potential connecting line for connecting said second logic circuit block and said first potential supply line, and
   a second potential connecting line for connecting said second logic circuit block and said second potential supply line.

5. The semiconductor integrated circuit device according to claim 1, wherein said second power supply line comprises an interconnecting line portion extending into said second direction and divided into a plurality of lines, and
   a power supply connecting line connecting said second logic circuit block and said annular power supply line, and provided on said substrate so as to extend in said second direction.

6. A semiconductor integrated circuit device having a plurality of logic circuit blocks of different sizes which are designed in advance on a logical function basis, comprising:
   a first logic circuit block provided on a substrate;
   a second logic circuit block being smaller than said first logic circuit block and provided on said substrate;
   an annular power supply line including a first power supply line extending in a first direction and a second power supply line extending in a second direction crossing said first direction and connected to said first power supply line, and so provided on said substrate as to surround said first logic circuit block;

a first power supply connecting line so provided on said substrate as to connect said first logic circuit block to said first power supply line and to extend in said second direction; and a second power supply connecting line so provided on said substrate as to connect said second logic circuit block to said second power supply line and to extend in said first direction.

7. The semiconductor integrated circuit device according to claim 6, wherein said annular power supply line comprises a first potential supply line for providing a first potential, and a second potential supply line for providing a second potential that is higher than said first potential.

8. The semiconductor integrated circuit device according to claim 7, wherein said first power supply connecting line comprises a first potential connecting line connecting said first logic circuit block and said first potential supply line, and a second potential connecting line connecting said first logic circuit block and said second potential supply line.

9. The semiconductor integrated circuit device according to claim 7, wherein said second power connecting line comprises a first power connecting line connecting said second logic circuit block and said first potential supply line, and a second potential connecting line connecting said second logic circuit block and said second potential supply line.

10. A method of designing a layout of a semiconductor integrated circuit device having a plurality of logic circuit blocks of different sizes which are designed in advance on a logical function basis, comprising the steps of:

providing a first logic circuit block on a substrate;

providing a second logic circuit block smaller than said first logic circuit block on said substrate;

providing an annular power supply line on said substrate so that it surrounds said first logic circuit block, the annular power supply line including a first power supply line extending in a first direction and a second power supply line extending in a second direction crossing said first direction and connected to said first power supply line, and said first power supply line including an interconnecting line portion extending in said first direction and divided into a plurality of lines; and providing a power supply connecting line on said substrate so that it connects said second logic circuit block to said annular power supply line and extends in said first direction.

11. A method of designing a layout of a semiconductor integrated circuit device having a plurality of logic circuit blocks of different sizes which are designed in advance on a logical function basis, comprising the steps of:

providing a first logic circuit block on a substrate;

providing a second logic circuit block, smaller than said first logic circuit block, on said substrate;

providing an annular power supply line on said substrate so that it surrounds said first logic circuit block, the annular power supply line including a first power supply line extending in a first direction and a second power supply line extending in a second direction, crossing said first direction, and connected to said first power supply line, said first power supply line including an interconnecting line portion extending in said first direction and divided into a plurality of lines; and providing a power supply connecting line on said substrate so that it connects said second logic circuit block to said annular power supply line and extends in said first direction, said power supply connecting line being so provided as to be aligned with said first power supply line.

* * * * *

UNITED STATES PATENT AND TRADEMARK OFFICE
CERTIFICATE OF CORRECTION

PATENT NO. : 5,315,182  
DATED : May 24, 1994  
INVENTOR(S) : Kazuhiro Sakashita, et al It is certified that error appears in the above-indentified patent and that said Letters Patent is hereby corrected as shown below:

The title page should be deleted and substitute therefor the attached title page.

Signed and Sealed this

Twenty-third Day of May, 1995

Attest:

BRUCE LEHMAN

Attesting Officer     Commissioner of Patents and Trademarks

United States Patent [19]

Sakashita et al.

[11] Patent Number: 5,315,182
[45] Date of Patent: May 24, 1994

[54] SEMICONDUCTOR INTEGRATED CIRCUIT HAVING ANNULAR POWER SUPPLY WITH PLURAL LINES

[75] Inventors: Kazuhiro Sakashita; Terukazu Yusa; Isao Takimoto; Takeshi Hashizume; Tatsunori Komoike, all of Hyogo, Japan

[73] Assignee: Mitsubishi Denki Kabushiki Kaisha, Tokyo, Japan

[21] Appl. No.: 918,525

[22] Filed: Jul. 23, 1992

[30] Foreign Application Priority Data

Jul. 30, 1991 [JP] Japan .................................. 3-189103

[51] Int. Cl.$^5$ ................................................. H03K 29/02
[52] U.S. Cl. ................................ 307/482.1; 307/465.1; 307/303.1; 257/207
[58] Field of Search ............. 257/207; 307/465, 465.1, 307/482.1, 303.1

[56] References Cited

U.S. PATENT DOCUMENTS

| | | | |
|---|---|---|---|
| 4,511,914 | 4/1985 | Remedi et al. .................. | 257/207 X |
| 4,575,745 | 3/1986 | Sharma et al. ................... | 257/207 |
| 4,701,778 | 10/1987 | Aneha et al. ................ | 307/482.1 X |
| 5,008,725 | 4/1991 | Yamamura et al. ............ | 257/207 |
| 5,079,612 | 1/1992 | Takamoto et al. ............. | 257/207 X |

FOREIGN PATENT DOCUMENTS 2-82552 3/1990 Japan .
2-86145 3/1990 Japan .

*Primary Examiner*—David R. Hudspeth
*Attorney, Agent, or Firm*—Lowe, Price, LeBlanc & Becker

[57] ABSTRACT

In designing a layout of a semiconductor integrated circuit device having a large scale circuit block and logic circuit elements provided together, a power supply connecting line is formed rectilinearly to increase the integration density, reduce power supply noise and achieve automation of layout and interconnection. The semiconductor integrated circuit device includes one large scale circuit block and a plurality of logic circuit elements. VDD and GND annular power supply interconnecting lines are provided to surround the large scale circuit block. The annular power supply interconnecting lines extending in the lateral direction are divided into two lines to be disposed, respectively. Connection of the logic circuit elements and the annular power supply interconnecting lines are made by rectilinear VDD and GND power supply branch interconnecting lines.

11 Claims, 29 Drawing Sheets